United States Patent
Pirim

(10) Patent No.: US 11,526,741 B2
(45) Date of Patent: Dec. 13, 2022

(54) AUTOMATED METHOD AND ASSOCIATED DEVICE FOR THE NON-VOLATILE STORAGE, RETRIEVAL AND MANAGEMENT OF MESSAGE/LABEL ASSOCIATIONS AND VICE VERSA, WITH MAXIMUM LIKELIHOOD

(71) Applicant: ANOTHER BRAIN, Paris (FR)

(72) Inventor: Patrick Pirim, Paris (FR)

(73) Assignee: ANOTHER BRAIN, Paris (FR)

( * ) Notice: Subject to any disclaimer, the term of this patent is extended or adjusted under 35 U.S.C. 154(b) by 545 days.

(21) Appl. No.: 16/499,793

(22) PCT Filed: Apr. 27, 2018

(86) PCT No.: PCT/EP2018/060923
§ 371 (c)(1),
(2) Date: Sep. 30, 2019

(87) PCT Pub. No.: WO2018/197689
PCT Pub. Date: Nov. 1, 2018

(65) Prior Publication Data
US 2020/0050930 A1 Feb. 13, 2020

(30) Foreign Application Priority Data
Apr. 28, 2017 (FR) ....................... 1700463

(51) Int. Cl.
*G11C 13/00* (2006.01)
*G06N 3/063* (2006.01)
(Continued)

(52) U.S. Cl.
CPC ......... *G06N 3/0635* (2013.01); *G06F 3/0659* (2013.01); *G06F 3/0679* (2013.01);
(Continued)

(58) Field of Classification Search
CPC .... G06N 3/0635; G06N 3/063; G06N 3/0445; G06F 3/0659; G06F 3/0679; G06F 13/1668; G06F 3/0607; G11C 13/0026
See application file for complete search history.

(56) References Cited

U.S. PATENT DOCUMENTS 6,067,417 A * 5/2000 Wise ................ H04N 19/42
712/201
7,709,359 B2 5/2010 Boescke et al.
(Continued)

FOREIGN PATENT DOCUMENTS

FR 2 964 222 A1 3/2012
FR 2 980 876 A1 4/2013
(Continued)

OTHER PUBLICATIONS

Gripon, et al., "Maximum Likelihood Associative Memories", 2013 IEEE Information Theory Workshop (ITW), Sep. 2013.
(Continued)

*Primary Examiner* — Mohammed A Bashar
(74) *Attorney, Agent, or Firm* — BakerHostetler

(57) ABSTRACT

An associative-memory-storage unit, and to an associative-memory-storage method are provided. The associative-memory-storage unit includes a first subset of at least memory sub-units over w bits, and a second memory sub-unit over v bits. The associative-memory-storage sub-unit may be used to associate messages with labels, and vice versa.

52 Claims, 10 Drawing Sheets

(51) Int. Cl.
*G06F 13/16* (2006.01)
*G06F 3/06* (2006.01)
(52) U.S. Cl.
CPC ...... *G06F 13/1668* (2013.01); *G11C 13/0026* (2013.01); *G06F 3/0607* (2013.01)

(56) References Cited

U.S. PATENT DOCUMENTS

| | | | |
|---|---|---|---|
| 9,299,430 | B1 | 3/2016 | Bertin et al. |
| 9,401,208 | B2 | 7/2016 | Cambou |
| 2003/0156652 | A1* | 8/2003 | Wise ................. G06F 13/16 711/E12.003 |
| 2007/0239644 | A1 | 10/2007 | Minamino et al. |
| 2010/0238741 | A1* | 9/2010 | Miyatake ............ G11C 17/18 365/225.7 |

FOREIGN PATENT DOCUMENTS

| | | |
|---|---|---|
| JP | 61-148547 A | 7/1986 |
| JP | 2000-222884 A | 8/2000 |
| WO | 2014/203039 A1 | 12/2014 |

OTHER PUBLICATIONS

Pirim, et al., "Perceptive Invariance and Associative Memory Between Perception and Semantic Representation, USER a Universal Semantic Representation Implemented in a System on Chip (SoC)", Network and Parallel Computing, pp. 275-287, Jul. 12, 2016.

Pagiamtzis, et al., "Content-addressable memory (CAM) circuits and architectures: A tutorial and survey", IEEE Journal of Solid-State Circuits, vol. 41, No. 3, pp. 712-727, Mar. 2006.

Pagiamtzis, et al., "A low-power content-addressable memory (CAM) using pipelined hierarchical search scheme", IEEE Journal of Solid-State Circuits, vol. 39, Issue 9, pp. 1512-1519, Sep. 2004.

Pirim, et al., "Generic Bio-inspired Chip Model-Based on Spatio-temporal Histogram Computation: Application to Car Driving by Gaze-Like Control", Jul. 29, 2013.

Gripon, et al., "Sparse neural networks with large learning diversity", IEEE trans. on Neural Networks, vol. 22, No. 7, pp. 1087-1096, Jul. 2011.

Jarollahi, et al., "A low-power Content-Addressable Memory based on clustered-sparse networks", ASAP, 2013 IEEE 24th int. conference.

Leduc-Primeau, et al., "Clusterbased associative memories built from unreliable storage", Proc. Of IEEE Intl. Conf. on Acoustics, Speech, and Signal Processing (ICASSP), May 2014.

Ferro, et al., "Nearest Neighbour Search Using Binary Neural Networks", International Joint Conference on Neural Networks (IJCNN) 2016.

Guo, et al., "A Resistive TCAM Accelerator for Data-Intensive Computing", MICRO'11 Dec. 3-7, 2011.

Guo, et al., "AC-DIMM: Associative Computing with STT-MRAM", ISCA '2013.

Takahashi, "Text search processor", The first edition, The Institute of Electronics, Information and Communication Engineers, pp. 64-67, Dec. 25, 1991.

Inoue, et al., "Set Operating Processor (SOP), Application for Image recognition", IEICE Technical Report, vol. 113, No. 237, The Institute of Electronics, Information and Communication Engineers, pp. 35-40, Sep. 30, 2013.

Notice of Rejection issued in Japanese Patent Application No. 2019-554640 dated Jan. 12, 2021, with English Translation.

* cited by examiner

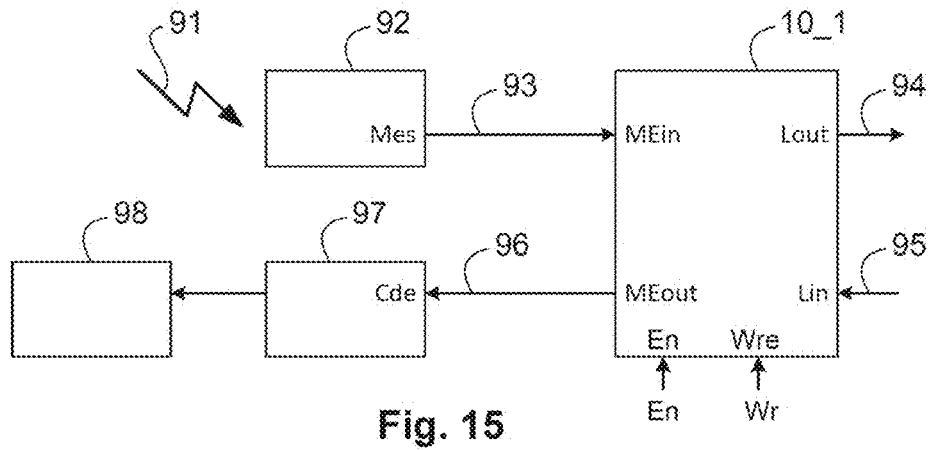
Fig. 15
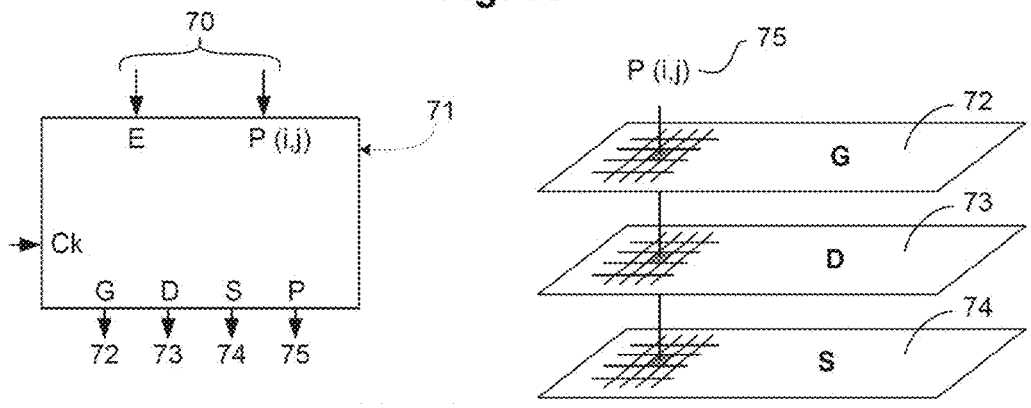
a    Fig. 11    b
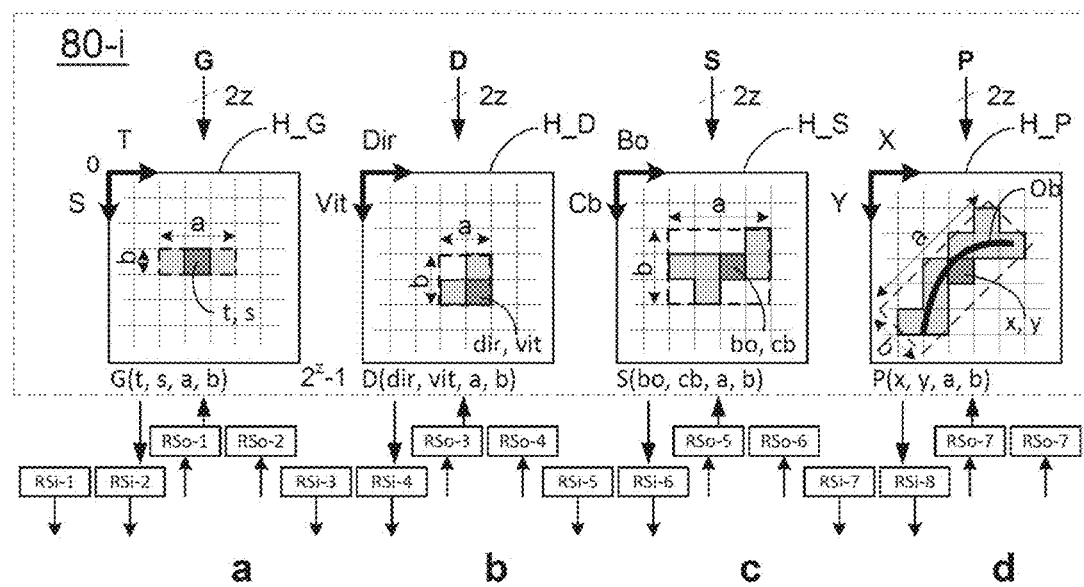
Fig. 12

AUTOMATED METHOD AND ASSOCIATED DEVICE FOR THE NON-VOLATILE STORAGE, RETRIEVAL AND MANAGEMENT OF MESSAGE/LABEL ASSOCIATIONS AND VICE VERSA, WITH MAXIMUM LIKELIHOOD

CROSS-REFERENCE TO RELATED APPLICATIONS

This application is a National Stage of International patent application PCT/EP2018/060923, filed on Apr. 27, 2018, which claims priority to foreign French patent application No. FR 1700463, filed on Apr. 28, 2017, the disclosures of which are incorporated by reference in their entirety.

FIELD OF THE INVENTION

The present invention relates to a method and to an automatic device able to store in memory, recall and, manage in a non-volatile way, associations of messages versus labels et vice versa, with a maximum likelihood. It also relates to a system for storing in memory training data for networks of neuronal populations.

The invention is in particular applicable to the implementation of neural networks on-silicon for processing various signals, including multidimensional signals such as the representation of perception of images, sound or other modalities perceived independently or simultaneously for example. More generally, the invention allows a complete chain for processing signals via the bio-inspired approach of networks of neuronal populations to the effectively produced on-silicon. It also allows conventional signal-processing methods, used for example in preprocessing before the neuronal processing and/or in post-processing, to be effectively carried out.

BACKGROUND

Human memory is fundamentally associative: we remember better when we are able to link the new information to knowledge that has already been acquired and that is solidly anchored in our memory. Furthermore, the greater the meaning it has for us, the more effective this link will be. Rather than simple recall of fixed impressions, memory is therefore at the present time considered to be a continual process of re-categorization stemming from a continuous change in antagonistic neuronal pathways and from parallel processing of information in the brain.

Technology is attempting to copy these processes mainly using the electronic method referred to as associative memory or content-addressable memory (CAM). A review of the literature has been published in the publication K. Pagiamtzis et A. Sheikholeslami, "Content-addressable memory (CAM) circuits and architectures: A tutorial and survey" *IEEE Journal of Solid-State Circuits*, vol. 41, no. 3, pp. 712-727, March 2006.

This storage mechanism has become non-volatile with the appearance of MRAM (Magnetic Random Access Memory) memories in which data are stored in the form of a magnetic orientation. The change of state is achieved by changing the spin of the electrons (in particular by tunneling). These components are sold by Everspin inter alia.

In France, an MRAM technology has been codeveloped by the laboratory Spintec of the CNRS and the company Crocus Technology in Grenoble. It is based on an innovative programming technique that allows limitations with respect to stability and miniaturization to be overcome. Instead of the conventional stacks of ferromagnetic layers, these partners have developed a memory cell that associates a ferromagnetic layer with an antiferromagnetic layer that is more stable with temperature. This cell is combined with a self-referenced memory cell technology that allows a comparison logic function called Match-In-Place to be integrated directly into the memory plane. Patent U.S. Pat. No. 9,401,208 B2 "Magnetic random access memory cell with a dual junction for ternary content addressable memory applications" of the same company describes the integration of a ternary mode: the ternary CAM allows one or more bits in the given stored word to be programmed to a third state, referred to as "X", or "don't care" in the above patent, allowing the flexibility of the search to be increased. For example, a ternary CAM could have a stored word of "10XX0", which would correspond to searches for any of the words "10000", "10010", "10100" and "10110".

This memory cell is of STT-MRAM type (STT-MRAM standing for spin-transfer torque magnetic RAM). Its dimensions permit large-scale, low-cost integration, a very low power consumption and the guarantee of a very long retention of information.

Another type of non-volatile memory, called N-RAM for Nano-RAM, which is the fruit of research carried out by Nantero, an American firm, is currently emerging. It uses the characteristics of carbon nanotubes, which allow the size of a chip to be considerably decreased and therefore the capacity of a module to be increased. This type of memory is described in patent No. U.S. Pat. No. 9,299,430 B1 "Method for reading and programming 1-R resistive charge element arrays" of this firm.

This cell is composed of a certain number of nanotubes suspended above an electrode. When a current passes between the two electrodes, the nanotubes are attracted to the upper electrode and make contact therewith. In the case where there is no current between the two electrodes, the carbon nanotubes remain suspended in the air. To determine whether the nanotubes are touching the upper electrode or not, a voltage is deployed between a terminal and the upper electrode. If a current passes, this means that the nanotubes are making contact with the upper electrode and the value 1 is returned. If a current does not pass, the nanotubes are suspended and the value 0 is returned. The values 0 and 1 are therefore so-called stable positions, because there is no mechanical tension on the nanotubes. This architecture is more favorable to decrease in etch pitch than DRAM and requires less current to write data while having similar speeds to SRAM.

Another non-volatile memory technique based on a hafnium-oxide ferroelectric, and described in patent U.S. Pat. No. 7,709,359, is very promising because of its small cell size, about $10F^2$, of the fact that its consumption in write mode is at least 1000 times lower than that of STT-MRAM, and of its fabrication compatibility with CMOS technology (both in terms of etching scale and in terms of process compatibility).

These technologies have given rise to several developments published in the field of neuronal sciences, including that of:

V. Gripon and C. Berrou, "Sparse neural networks with large learning diversity," IEEE trans. on Neural Networks, vol. 22, n 7, pp. 1087-1096, July 2011. This article gives a definition of:

learning diversity enabled by data sparsity given an amount of stored information M, in the following description: equal to $2^v$ with an amount of code corresponding to the sub-message $I=2^w$, le message k consisting of c sub-messages (in the following description: a message ME consists of n sub-messages). The length of the message ME is therefore n times w bits and the diversity of the storage mechanism is $2^{n+w}$.

The density d which, for a value of M>>c (here $2^v$>>n~8) and M<<$I^2$ (here $2^v$<<$2^{n+w}$) is close to $M/I^2$, i.e. in the following description:

$$d=2^v/2^{2+w} \text{ or } 2^{v-(2+w)}.$$

This density must be low in order to avoid confusion of the learnt messages corresponding to the admissible error rate: with the values of v=16 and w=24, d=$2^{-10}$, i.e. an error rate close to 0.001.

Associated with this article, the authors have filed two patents: FR2964222A1 and FR2980876A1 describing a neuronal device using these principles.

Hooman Jarollahi, Vincent Gripon, Naoya Onizawa, and Warren J. Gross "*A low-power Content-Addressable Memory based on clustered-sparse networks*" ASAP, 2013 IEEE 24th int. conference.

F. Leduc-Primeau, V. Gripon, M. G. Rabbat, and W. J. Gross, "*Clusterbased associative memories built from unreliable storage*" in Proc. Of IEEE Intl. Conf. on Acoustics, Speech, and Signal Processing (ICASSP), May 2014. Demetrio Ferro, Vincent Gripon, Xiaoran Jiang, "*Nearest Neighbour Search Using Binary Neural Networks*" International Joint Conference on Neural Networks (IJCNN) 2016.

Qing Guo, Xiaochen Guo, Yuxin Bai, Engin_Ipek, "*A Resistive TCAM Accelerator for Data-Intensive Computing*" MICRO'11 Dec. 3-7, 2011, Porto Alegre, Brazil et, Qing Guo, Xiaochen Guo, Ravi Patel, Engin_Ipek, Eby G. Friedman "*AC-DIMM: Associative Computing with STT-MRAM*", ISCA '2013 Tel-Aviv, Israel, have introduced these associative memory storage mechanisms into an electronic component arranged to form a DIMM-format memory strip, in replacement of the existing ones, and they therefore use the existing bus layout.

All these approaches to associative memory storage do not allow a concomitant operation in the two directions (bottom-up and top-down) that exist in human memory while allowing information to be dynamically fedback. Furthermore, the elements stored in memory are not simply transferable from one medium to another.

Another approach has been suggested by P. Pirim, the author of the present invention, with the aim of overcoming these drawbacks, in a publication: "Perceptive Invariance and Associative Memory Between Perception and Semantic Representation, USER a Universal Semantic Representation Implemented in a System on Chip (SoC)" published in Living Machines 2016, LNAI 9793, pp. 275-287, 2016. This first succinct approach has been followed by many improvements, which are described in this invention. A new associative memory model has been created by integrating new TCAM techniques allowing error correction via a computation of maximum likelihood in a large-scale, low-cost integration.

SUMMARY OF THE INVENTION

The invention therefore relates to a method and to an automatic device able to store in memory, recall and, manage in a non-volatile way, associations, with a maximum likelihood, of messages versus labels and vice versa—called "associative memory storage" in the rest of the text.

This associative-memory-storage method is composed of a set of at least two similar content-addressable memory sub-units of $2^v$ words of w bits for the first, with v comprised between 1 and w and, of $2^v$ words of v bits for the second.

The associative-memory sub-unit is programmed in write mode via,
 a v-bit input-mode address port,
 a v- or w-bit input-mode data port and
 a command port comprising a sequencing binary input clock and two binary input signals, one for selecting the memory and the other for writing, these two signals being validated in this write sequence, allowing, during this cycle, the word of v or w bits present on the data port to be stored at the memory position addressed by the word of v bits on the address port,
and the same associative-memory sub-unit is programmed in read mode via,
 a command port comprising, a sequencing binary input clock, two binary input signals, one for selecting the valid memory, and the other for invalid writing in this read sequence and a binary output signal for validating the content present according to the invention in this read mode:
  a datum of v or w bits, recorded beforehand in write mode, said datum being on a data output port is read, which is selected by a word of v bits present on the input address port, and read and independently,
  a datum of v bits, corresponding to the address of the datum of v or w bits present on the input data port is read, said datum being on a memory-content-address output port, if precedingly this datum of v or w bits has been stored in write mode at at least one memory position, thereby validating the output binary signal for validating the present content. In the contrary case, where none of the $2^v$ memory positions contains the datum of v or w bits fed to the input data port, the invalid output of the memory-content-address output port is signaled by the invalidation of the output binary signal for validating the present content.

In various implementations of the invention, the following means, which may be used alone or in any technically foreseeable combinations, are employed:
 the associative-memory-storage unit being selected in read mode, (Wr=0), at least two similar memory sub-units are associated via two independent buses of v bits:
  the first bus, connected between the v-bit memory-content-address output port of the first associative memory and the v-bit input-mode address port of the second associative memory and,
  the second bus, connected between the v-bit memory-content-address output port of the second associative memory and the v-bit input-mode address port of the first associative memory,
 the associative-memory-storage unit selected being in write mode, at least two similar memory sub-units are associated via a v-bit common bus connected to the output of a v-bit binary counter, and connected to the v-bit input-mode address port of each associative memory,
 the associative-memory-storage unit possesses an initialization phase, involving all of the present memory sub-units, said phase being commanded by a unit for initializing the memory sub-units, which is triggered by the validation of the input binary signals for initializing and selecting all of the memories, which is output from the command port. This initializing unit initializes to zero the v-bit binary counter, then increments it by one unit on each sequencing binary input clock cycle during $2^v+1$ cycles. During this lapse of time, the initializing unit validates the write mode, (validated write binary input signal), and forces to zero the data input port (In) of each of the memory sub-units. At the end of the sequence, all the memory positions of each of the memory sub-units are initialized to zero as is the v-bit binary counter, outside of the initialization sequence, the memory-selecting binary input signal being validated, the v-bit binary counter (3) is incremented by a unitary value at the start of each validation of the memory write signal, a count-limit signal is validated when the value of the v-bit binary counter reaches the value $2^v-1$, programmed in read mode, the memory sub-units are grouped together into two sets, the first integrating n memory sub-units each comprising $2^v$ words of w bits, the second being represented by an associative-memory sub-unit comprising $2^v$ words of v bits, these two sets being linked by two antagonistic buses:

the first bus, which is connected to the v-bit memory-content-address output port of the associative-memory sub-unit comprising $2^v$ words of v bits, is connected to the v-bit input-mode address port of each of the n memory sub-units.

the second bus, which is the output of each of the v-bit memory-content-address output ports and of their binary output signals for validating respective content present in all of the n memory sub-units, is introduced into a unit for selecting the maximum likelihood of the input values, which delivers as output the most represented selected value. This value of the maximum likelihood is introduced into the v-bit input-mode address port of the associative-memory sub-unit comprising $2^v$ words of v bits.

by validating a correcting binary input signal in read mode, information items are transmitted from the output of the unit of value of the maximum likelihood to the first bus described above, programmed in write mode, the value of the v-bit binary counter is incremented by one unit at the start of the write cycle in order to deliver a value corresponding to the new address over a bus connected to all the v-bit input-mode address ports of each associative-memory sub-unit grouped into two sets, the first incorporating n associative memories each comprising $2^v$ words of w bits, the second being represented by an associative-memory sub-unit comprising $2^v$ words of v bits, grouped together, these two sets of memory sub-unit, including the v-bit binary counter, the unit for computing the maximum likelihood, the initializing unit, and the various logic control elements, form the basic unit of the associative memory storage mechanism, in read mode, the associative-memory-storage unit is associated with a message (MEin_i) consisting of n independent sub-messages (RSin_1 to RSin_n) of w input bits and with a label (Lout_j) of v output bits, and vice versa inputwise, a v-bit label (Lin_i) is associated with, outputwise, a message (MEout_j) consisting of n w-bit independent sub-messages (RSout_1 to RSout_n): the presence of an even partial message (MEin_i) fed to the basic unit of the associative memory (10) delivers as output a label (Lout_i), returnwise, this label becomes (Lin_i) and, being connected as input to the associative memory-storage unit (10), delivers the complete precedingly learnt corresponding message (MEout_i), each w-bit independent input sub-message (RSin_x) and w-bit independent output sub-message (RSout_x) is structured into p elements of w/p bits with, for each element, a definition specific to its location, each element of w/p bits can be placed independently if necessary in ternary-content-addressable-memory (TCAM) mode, the w-bit output sub-message (RSout_x) of the associative-memory unit is connected to the input-register unit of a dynamic attractor and the result-register unit of the same dynamic attractor delivers the w-bit input sub-message (RSin_x) of the associative-memory unit, the p elements of w/p bits of the w-bit independent input sub-message (RSin_x) and w-bit independent output sub-message (RSout_x) have, as definition specific to its location, an elementary semantic representation of global, dynamic or structural type, the dynamic attractor extracts, from the streams of sub-sequence-containing sequenced data output from a unit for converting an input data flow, an elementary semantic representation of global type, dynamic type or structural type referenced by position and corresponding to a sub-message, by dynamic recruitment of the dynamic attractors with inhibition of the antecedents (linkage Cout of the dynamic attractor (80_x) to Cin of the dynamic attractor (80_x+1)). Each dynamic attractor dependingly defines a sub-message the entirety of which corresponds to the transmitted message, the basic associative-memory-storage units are connected in inverse pyramidal mode, a first level of p basic associative-memory units receiving p messages and generating p labels that are each connected by way of sub-messages to a basic associative-memory unit in a second level, thereby generating a label summarizing the input sub-messages, and conversely a second summarizing label input into this basic associative-memory unit generates a set of sub-messages that are connected by way of a label associated with a sub-message to the set of p basic associative-memory units of the first level and delivers a set of p messages, the memory sub-units representing the basic associative-memory unit are associated in read mode via a v-bit common bus connected to the output of a v-bit binary counter and connected to the v-bit input-mode address port of each associative-memory sub-unit, this v-bit binary counter being initialized to zero then incremented by one unit on command by a transfer binary signal. In each transfer sequence, the value of the message (RSout_i) and of its associated label (Lout_i) are accessible, transfer of knowledge from the acquired associative memory storage of one unit to another is achieved by associating a first associated-memory-storage unit in transfer read mode with a second associative-memory-storage units in write mode by connecting, with respect to the distribution of the information items, the output ports of the first unit to the input ports of the second unit, and by synchronizing the read cycle of the first unit with the write cycle of the second unit.

According to the invention, the associative-memory-storage device is composed of a set of at least two similar content-addressable memory sub-units of $2^v$ words of w bits for the first, with v comprised between 1 and w and, of $2^v$ words of v bits for the second.

The associative-memory sub-unit is programmed in write mode via,
- a v-bit input-mode address port,
- a v- or w-bit input-mode data port and
- a command port comprising, a sequencing binary input clock and two binary input signals, one for selecting the memory and the other for writing, these two signals being validated in this write sequence, allowing, during this cycle, the word of v or w bits present on the data port to be stored at the memory position addressed by the word of v bits on the address port, and the same associative-memory sub-unit is programmed in read mode via,
- a command port comprising, a sequencing binary input clock, two binary input signals, one for selecting the valid memory, and the other for invalid writing in this read sequence and a binary output signal for validating the content present according to the invention in this read mode:
  - either a data output port that delivers a datum of v or w bits, recorded beforehand in write mode, said datum being selected by a word of v bits present on the input address port and independently
  - either a memory-content-address output port that delivers a datum of v bits, corresponding to the address of the datum of v or w bits present on the input data port, if precedingly this datum of v or w bits has been stored in write mode at at least one memory position, thereby validating the output binary signal for validating the present content. In the contrary case, where none of the $2^v$ memory positions contains the datum of v or w bits present on the input data port, the invalid output of the memory-content-address output port is signaled by the invalidation of the output binary signal for validating the present content.

In various implementations of the invention, the following means, which may be used alone or in any technically foreseeable combinations, are employed:
- the associative memory is in non-volatile technology.
- selected in read mode, the associative-memory-storage unit consists of at least two similar memory sub-units that are associated via two independent buses of v bits:
  - the first bus, connected between the v-bit memory-content-address output port of the first associative memory and the v-bit input-mode address port of the second associative memory and,
  - the second bus, connected between the v-bit memory-content-address output port of the second associative memory and the v-bit input-mode address port of the first associative memory,
- selected in write mode, the associative-memory-storage unit consists of at least two similar memory sub-units that are associated via a v-bit common bus connected to the output of a v-bit binary counter, and connected to the v-bit input-mode address port of each associative memory,
- the unit for counting $2^v$ values employs non-volatile memory storage,
- the associative-memory-storage unit possesses an initialization phase, involving all of the present memory sub-units, said phase being commanded by a unit for initializing the memory sub-units, which is triggered by the validation of the input binary signals for initializing and selecting all of the memories, which is output from the command port. This initializing unit initializes to zero the v-bit binary counter, then increments it by one unit on each sequencing binary input clock cycle during $2^v+1$ cycles. During this lapse of time, the initializing unit validates the write mode, (validated write binary input signal), and forces to zero the data input port of each of the memory sub-units. At the end of the sequence, all the memory positions of each of the memory sub-units are initialized to zero as is the v-bit binary counter,
- outside of the initialization sequence, the memory-selecting binary input signal being validated, the v-bit binary counter is incremented by a unitary value at the start of each validation of the memory write signal,
- the v-bit binary counter comprises a count-limit signal as output that becomes valid when the binary value of the counter is equal to $2^v-1$.
- programmed in read mode, the memory sub-units are grouped together into two sets, the first integrating n memory sub-units each comprising $2^v$ words of w bits, the second being represented by an associative-memory sub-unit comprising $2^v$ words of v bits, these two sets being linked by two antagonistic buses:
  - the first bus, which is connected to the v-bit memory-content-address output port of the associative-memory sub-unit comprising $2^v$ words of v bits, is connected to the v-bit input-mode address port of each of the n memory sub-units.
  - the second bus, which is the output of each of the v-bit memory-content-address output ports and of their binary output signals for validating respective content present in all of the n memory sub-units, is introduced into a unit for selecting the maximum likelihood of the input values, which delivers as output the most represented selected value. This value of the maximum likelihood is introduced into the v-bit input-mode address port of the associative-memory sub-unit comprising $2^v$ words of v bits,
- by validating a read-mode correcting binary input signal, the information items transmitted to the first bus described above are output from the output of the unit of value of the maximum likelihood,
- programmed in write mode, the value of the v-bit binary counter is incremented by one unit at the start of the write cycle in order to deliver a value corresponding to the new address over a bus connected to all the v-bit input-mode address ports of each of the associative-memory sub-unit grouped into two sets, the first incorporating n associative memories each comprising $2^v$ words of w bits, the second being represented by an associative-memory sub-unit comprising $2^v$ words of v bits,
- grouped together, these two sets of memory sub-units, including the v-bit binary counter, the unit for computing the maximum likelihood, the initializing unit, and the various logic control elements, form the basic unit of the associative memory storage mechanism,
- in read mode, the associative-memory-storage unit associates a message (MEin_i) consisting of n independent sub-messages (RSin_1 to RSin_n) of w input bits with a label (Lout_j) of v output bits, and vice versa on input, a v-bit label (Lin_i) associates, on output, a message (MEout_j) consisting of n w-bit independent sub-messages (RSout_1 to RSout_n): the presence of an even partial message (MEin_i) fed to the basic unit of the associative memory (10) delivers as output a label (Lout_i), returnwise, this label becomes (Lin_i)

and, being connected as input to the associative memory-storage unit (10), delivers the complete precedingly learnt corresponding message (MEout_i), each w-bit independent input sub-message (RSin_x) and w-bit independent output sub-message (RSout_x) is each structured into p elements of w/p bits with, for each element, a definition specific to its location, each element of w/p bits can be placed independently if necessary in ternary-content-addressable-memory (TCAM) mode, the w-bit output sub-message (RSout_x) of the associative-memory unit is connected to the input-register unit of a dynamic attractor and the result-register unit of the same dynamic attractor delivers the w-bit input sub-message (RSin_x) of the associative-memory unit, the p elements of w/p bits of the w-bit independent input sub-message (RSin_x) and w-bit independent output sub-message (RSout_x) have, as definition specific to its location, an elementary semantic representation of global, dynamic or structural type, the dynamic attractor extracts, from the streams of sub-sequence-containing sequenced data output from a unit for converting an input data flow, an elementary semantic representation of global type, dynamic type or structural type referenced by position and corresponding to a sub-message, by dynamic recruitment of the dynamic attractors with inhibition of the antecedents (linkage Cout of the dynamic attractor to Cin of the dynamic attractor. Each dynamic attractor dependingly defines a sub-message (Rsin_x) the entirety of which corresponds to the transmitted message (ME_in), the basic associative-memory-storage units are connected in inverse pyramidal mode, a first level of p basic associative-memory units receiving p messages and generating p labels that are each connected by way of sub-messages to a basic associative-memory unit in a second level, thereby generating a label summarizing the input sub-messages, and conversely a second summarizing label input into this basic associative-memory unit generates a set of sub-messages that are connected by way of a label associated with a sub-message to the set of p basic associative-memory units of the first level and delivers a set of p messages, the memory sub-units representing the basic associative-memory unit are associated in read mode via a v-bit common bus connected to the output of a v-bit binary counter and connected to the v-bit input-mode address port of each associative-memory sub-unit, this v-bit binary counter being initialized to zero then incremented by one unit on command by a transfer binary signal T. In each transfer sequence, the value of the message and of its associated label are accessible, transfer of knowledge from the acquired associative memory storage of one unit to another is achieved by associating a first associated-memory-storage unit in transfer read mode with a second associative-memory-storage units in write mode by connecting, with respect to the distribution of the information items, the output ports of the first unit to the input ports of the second unit, and by synchronizing the read cycle of the first unit with the write cycle of the second unit.

The invention also relates to the following applications of all the possible variants of the preceding method and device:

this basic unit of the associative memory is integrated into an electronic component, this basic unit of the associative memory is stacked on an electronic chip.

BRIEF DESCRIPTION OF THE DRAWINGS

The present invention will now be described by way of example in the following description, without however being limited thereto, and with reference to the following figures.

DETAILED DESCRIPTION

Figure 1:
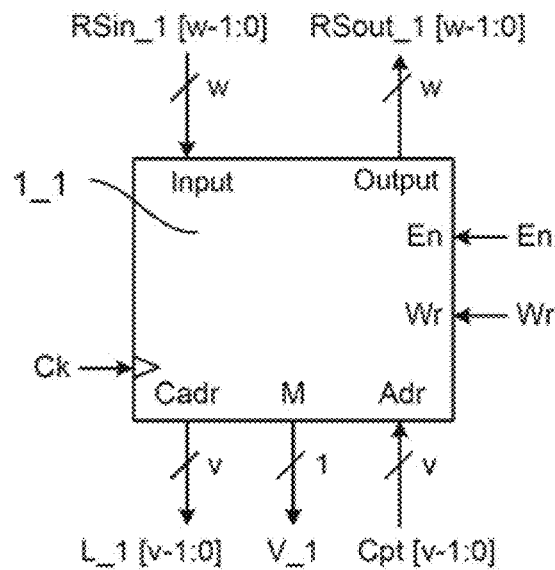
FIG. 1 shows, in its generality, a device according to the invention describing the associative-memory sub-unit (1_1)

FIG. 1 shows the basic element of the associative-memory-storage unit (10): the memory sub-unit (1_1) of a set of n independent TCAM or CAM memory sub-units denoted (1_1) to (1_n), i being the number of the unit (1_i). These memory sub-units may operate in RAM or CAM mode, and are non-volatile. According to various embodiments of the invention, these memory sub-units may be of various types, for example of STT-MRAM (spin-transfer torque magnetic random access memory), ferroRAM or NRAM type or any other type allowing the memory to operate in RAM or CAM mode. The behavior is that of RAM and CAM memory because of the integration of the logic comparison function into each elementary memory cell, the doubling of the spintronic junction allowing a third state called "X", in order to form a TCAM memory. Each memory sub-unit ($1\_i$) of $2^v$ words of w bits is composed:
- a w-bit input port (in);
- a w-bit output port (out);
- a v-bit memory-address input port (Adr);
- a v-bit output port (Cadr) associated with a comparison-validating binary output signal (M); and
- a command port composed of the command binary input signals (En) and (Wr) and of a sequencing clock binary input signal (Ck).

For each of the memory sub-units ($1\_i$), there are three possible states depending on the level, output from the command bus, of the signals (En) and (Wr), which are sequenced by a clock signal (Ck) present respectively on the command port in position (En), (Wr), and (Ck):

i) When the signals (En) and (Wr) are inactive the memory sub-unit ($1\_i$) is blocked and its consumption is almost zero.

ii) When the signal (En) is active and the signal (Wr) is inactive, the CAM read mode is triggered for the w-bit message (RSin_i) present on its input (in), which is compared to the content of all the memory addresses of the memory sub-unit ($1\_i$) in order to extract the v-bit address (L_i) containing the message (RSin_i), in the memory sub-unit ($1\_i$) on the port (Cadr) if present thereby validating a signal (M), and invalidating this signal (M) in the contrary case. Likewise, when the signal (En) is active and the signal (Wr) is inactive, the RAM read mode is triggered for a v-bit datum (Cpt) positioned as input on the address port (Ard), which validates a memory position the w-bit content (RSout_i) of which is transmitted to the output port (out).

iii) When the signals (En) and (Wr) are active, the RAM write mode is triggered for the sub-message (RSin_i) present on the input port (In), which is stored in memory at the memory address (Cpt) present on the input port (Adr).

Figure 2:
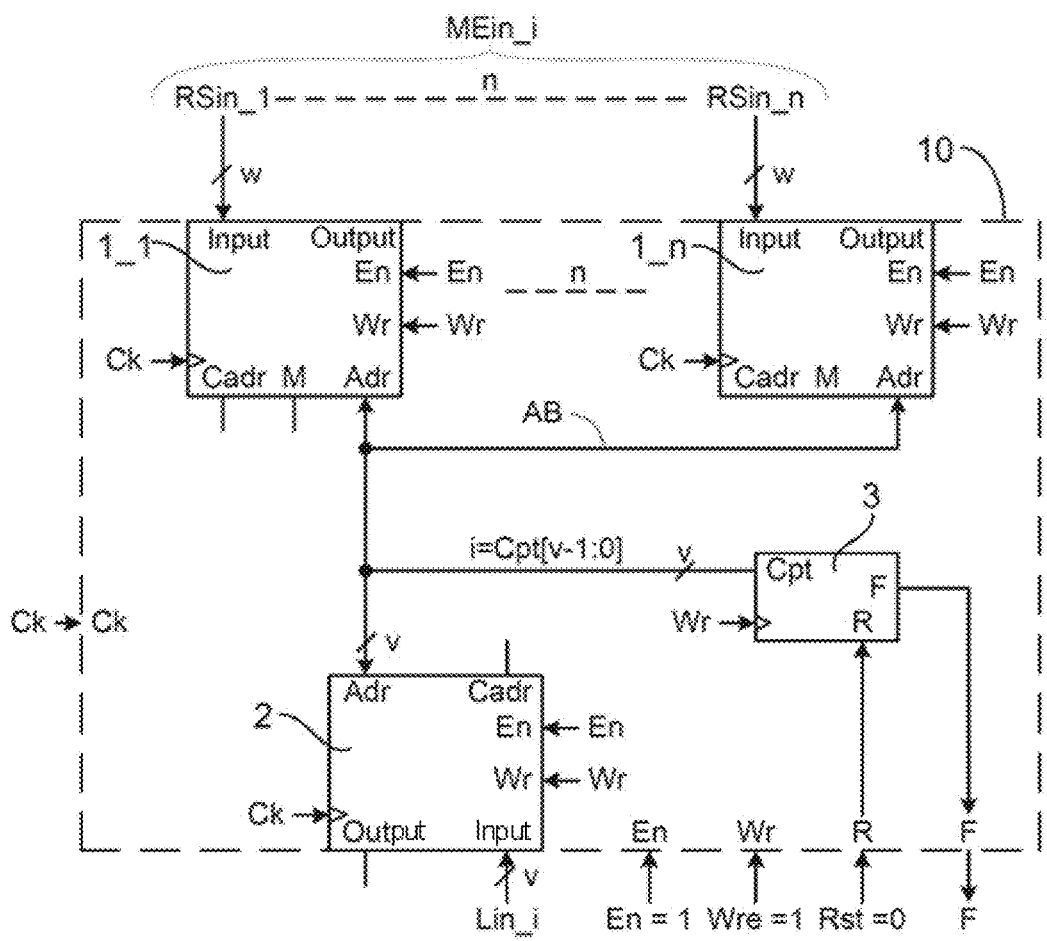
FIG. 2 is an illustration of the write mode of the associative-memory unit (10) incorporating a plurality of associative-memory sub-units (1_i) of FIG. 1, FIG. 3, an example of a grouping together of two associative-memory sub-units in read mode according to the invention, FIG. 4, an illustration of the operating mode of FIG. 3 extended to more than two sub-units and incorporating a unit for computing maximum likelihood and a looped operating mode, (Cor)=1, FIG. 5, an example of the associative-memory unit in initialization mode according to the invention, FIG. 6, an illustration of the operating mode of the associative-memory unit (10) in knowledge-transfer mode, FIG. 7, an example of knowledge transfer between two associative-memory units (10_1) and (10_2), FIG. 8, an illustration of the mode of correction of the input message by maximum likelihood, FIG. 9, an illustration of the associative-memory unit (10) in its entirety, FIG. 10, an example of use of the associative memory (10) in combination with dynamic-attractor units (80_i), FIG. 11, an illustration of the transfer function of the linguistic-translating unit (70), FIG. 12, an illustration of the organization of the computations of bilinear histograms of the dynamic-attractor unit (80_i), FIG. 13, an example of layout in pyramidal mode of three associative-memory units (10_1) to (10_3) creating the hierarchical-graph universal-generator basic unit (60), FIG. 14, an illustration of the composition of a graph generating a label on the basis of processing of messages stored in memory, FIG. 15, an example of use of an associative-memory unit (10) commanding the response to a stimulus, FIG. 16, an embodiment in which the associative-memory unit (10) is integrated into a generic electronic component, FIG. 17, an embodiment in which the associative-memory unit (10) is integrated into a wafer.

FIG. 2 illustrates the write mode of the associated-memory unit (10) consisting in storing in memory a message (MEin_i), composed of n sub-messages (RSin_1) to (RSin_n), and a label (Lin_i) at a common memory address having the value i equal to (Cpt[v-1:0]) delivered by the unit for counting $2^v$ values (3), which employs non-volatile memory storage, and which is incremented by a unitary value on each memory-storage action.

This associative-memory unit (10) comprises, a unit (3) for counting $2^v$ values, which delivers the value i, and two sets of similar memory sub-units one memory sub-unit ($1\_1$) of which is illustrated in FIG. 1. The first set is composed of n memory sub-units (referenced ($1\_1$) to ($1\_n$)) each composed of $2^w$ words of w bits and that each receive, on their input port (In), the sub-message (RSin_1) for the memory sub-unit ($1\_1$) up to the sub-message (RSin_n) for the memory sub-unit ($1\_n$), respectively. The second set is composed of a memory sub-unit (2) of $2^v$ words of v bits that receives on the input port (In) the label (Lin_i).

The write mode of the associative-memory unit (10) is activated by the validation of the binary signals (En) and (Wr) positioned on the command port of each of the memory sub-units ($1\_1$) to ($1\_n$) and (2). The validation of the binary signal (Wr) increments by one unit the unit (3) for counting $2^v$ values, the initialization command (R) of this counting unit (3) being maintained at zero throughout the process of the write mode of the associative-memory unit (10) by the external binary input (Rst)=0. This new value i of the counter (3), which is equal to (Cpt[v-1:0]), is presented to the address input port (In) of each memory sub-unit without exception. The sequencing clock signal (Ck), fed to each memory sub-unit, validates the general memory storage of all the memory sub-units present in this associative-memory unit (10). The number of memory-storage operations of this associative-memory unit (10) is limited by the maximum value $2^v-1$ of the counting unit (3) that delivers, for this value, a limit binary signal (F).

Figure 3:
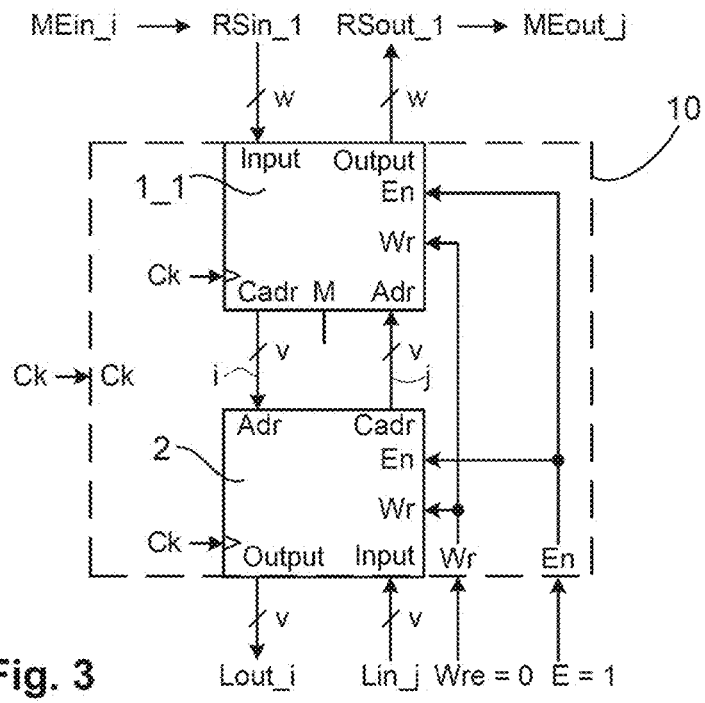

FIG. 3 illustrates the read mode of the associative-memory unit (10) in its simplest implementation in which each set consists of only one memory sub-unit.

The read mode of the associative-memory unit (10) is activated by validating the binary signal (En) and cancelling the signal (Wr), both thereof being positioned on the command port of each of the memory sub-units ($1\_1$) and (2).

The message (MEin_i) corresponds to the sub-message (RSin_1) fed to the input port (In) of the memory sub-unit ($1\_1$). The position i of the memory sub-unit ($1\_1$) containing the value (RSin_1) is delivered to its v-bit output port (Cadr) and fed to the input port (Adr) of the memory sub-unit (2). The content (Lout_i) of the memory sub-unit (2) in position i is delivered to its output port (Out).

The label (Lin_j) fed to the input port (In) of the memory sub-unit (2) delivers the value j of the position containing the value (Lin_j) to its v-bit output port (Cadr), which is connected to the input port (Adr) of the memory sub-unit ($1\_1$). The content (RSout_j) of the memory sub-unit ($1\_1$) in position j is delivered to its output port (Out). This sub-message (RSout_j) corresponds to the message MEout_j.

This read mode of the associative-memory unit (10) shows the association of the message (MEin_i) with the label (Lout_i) and conversely of the label (Lin_j) with the message (MEout_j).

Figure 4:
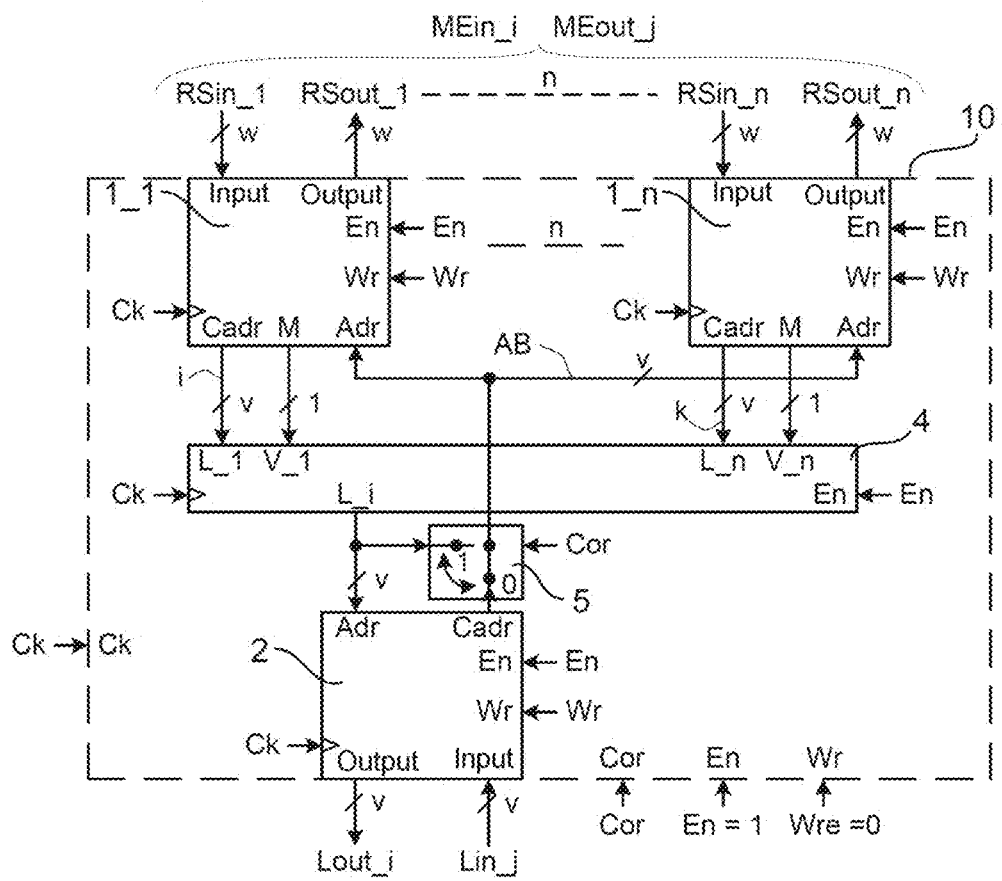

FIG. 4 is an extension of the read mode of the associative-memory unit (10) illustrated in FIG. 3 to its generic implementation in which the message (MEin_i) consists of n sub-messages (RSin_1) to (RSin_n). The first set is composed of n memory sub-units (referenced ($1\_1$) to ($1\_n$)) each composed of $2^w$ words of w bits and that each receive, on their input port (In), the sub message (RSin_1) for the memory sub-unit ($1\_1$) up to the sub-message (RSin_n) for the memory sub-unit ($1\_n$), respectively. The second set is composed of a memory sub-unit (2) of $2^v$ words of v bits that receives on the input port (In) the label (Lin_j).

In the label-to-message direction, the method is identical to that illustrated in FIG. 3. The arrival of (Lin_j) at the input port (In) of the memory sub-unit (2) causes the value j to be delivered to its output port (Cadr), this value j being transmitted to the bus AB through a link-value choosing unit (5) and fed to all the memory sub-units ($1\_1$) to ($1\_n$), which each deliver, via their respective output ports (Out), the respective sub-messages (RSout_1) to (RSout_n) that together form the message (MEout_j).

In the opposite direction, i.e. the message-to-label direction, the sub-messages (RSin_1) to (RSin_n), corresponding to the message (MEin_i), are respectively fed to the input port (In) of each memory sub-unit ($1\_1$) to ($1\_n$), which each deliver a value i or otherwise k to their respective output ports (Cadr) in association with a binary validation signal that is delivered, via the output (M) of the same memory sub-unit. In the case where the fed sub-message is absent from the memory sub-unit, the latter delivers, to its output (M), a binary invalidation signal, the value present on its output port (Cadr) then being ignored.

A unit (4) for computing maximum likelihood is introduced into the associative-memory-storage unit (10) in order to select the most represented value i, k, etc. This unit (4) receives, from the output port (Cadr) of each memory sub-unit (1_1) to (1_n) a value i, or otherwise k, respectively via an input port (L_i) to (L_n) with their respective validation binary signal via the input (V_1) to (V_n), respectively. Internal sequencing is assured via a clock signal (CK) introduced into the unit (4). The choice of the maximum likelihood is positioned on the output port (L_i), a v-bit bus transmitting this value to the input port (Adr) of the memory sub-unit (2), which delivers, via its output port (Out), the value of the label (Lout_i).

A v-bit value-choice linking unit (5) commanded by a binary signal (Cor) makes it possible to obtain two operating modes. When the binary value (Cor) is invalid, the description of operation corresponds to what has just been described. The validation of the binary signal (Cor) switches the bus (AB) from the output port (Cadr) of the memory sub-unit (2) to the output port (L_i) of the unit (4), this allowing a corrected message (MEout_i) of the deformed or partial input message (MEin_i) to be output. This embodiment allows a high retrieval power to be achieved, in particular in the presence of erasure or of partial messages.

Figure 5:
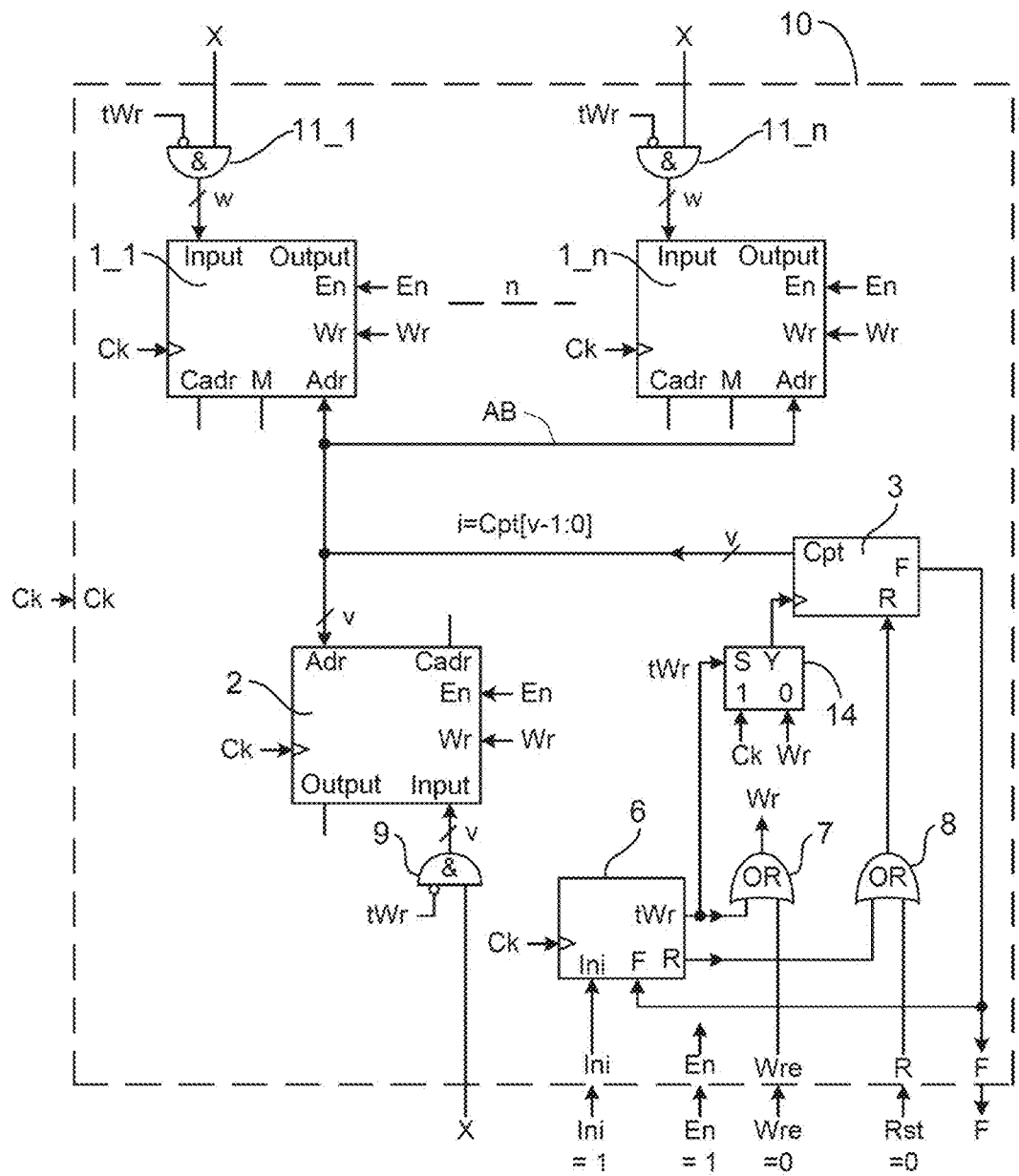

FIG. 5 details the initialization sequence of the associative-memory unit (10), which is indispensable for the correct operation thereof. The aim is to write the value zero to all the memory cells of the memory sub-units present in the associative-memory unit (10) and to initialize the counter (4) to zero, in order to be able, subsequently, in read mode, to store in memory $2^v-2$ message values with the exception of zero.

To the associative-memory unit (10) described above are added a unit (6) for sequencing the initialization, which is commanded externally via a binary signal (Ini), memory sub-units and logic elements (7), (8), (9), (11_1) to (11_n) and (14) allowing the initialization to operate.

Throughout the initialization cycle, the binary signal (tWr) delivered by the initialization-sequencing unit (6) is kept valid. The input port (In) of each of the memory sub-units (1_1) to (1_n) and (2) present in the associative-memory unit (10) receives, respectively, a datum equal to zero delivered by a logic unit containing w gates (11_1) to (11_n) that each respectively control the sub-messages (RSin_1) to (RSin_n) and, a logic unit containing v gates (9) that controls the label (Lin_i). Each logic gate is a Boolean "AND" function with two inputs one of which is inverted and receives the binary signal (tWr) and the second of which receives one of the bits of the sub-messages or label. Each bit of the sub-messages or label is, transmitted when the binary signal (tWr) is invalid or, forced to zero when the binary signal (tWr) is valid.

The initialization-sequencing unit (6) is sequenced by the clock signal (CK). This unit (6) receives the command binary signal (Ini) and a binary signal (F) that signals the count limit of the counter (3), and extracts a command binary signal (R) for zeroing the counter (3) and an initialization binary signal (tWr), which is valid throughout the duration of the initialization.

The validation of the initialization signal (Ini) during at least the time of one clock cycle (Ck) validates the initialization function of the associative-memory unit (10). This initialization starts with the validation during a first clock cycle (Ck) of the binary signal (R) for commanding the counter (3) to zero. This output (R) is connected to the input (R) of this counter (3) through an "OR" logic gate (8) with two inputs, the second input receiving the external binary signal (Rst) for zeroing this counter (3), the value of which is kept at zero during the time of this initialization. This counter (3) initializes the output value (Cpt) to zero from the start of the initialization cycle. The second clock cycle (Ck) validates as output the initialization binary signal (tWr). This initialization binary signal (tWr) is connected to the logic units (7), (14), (11_1) to (11_n) and (9). The logic unit (7) is an "OR" logic gate with two inputs that validates the binary signal (Wr) internal to the circuit output either with the output (tWr) of the unit (6) or with the external input (Wr) the value of which is kept at zero during the time of this initialization. The logic unit (14) is a multiplexer with two inputs and the output of which, which is connected to the input of the counting unit (3) and allows it to be incremented, corresponds to the clock binary signal (Ck) when the selecting input (S) of the same unit (14) receives the valid signal (tWr) and to the internal binary signal (Wr), output by the unit (7), when the selecting input (S) of the same unit (14) receives the invalid signal (tWr). Each clock cycle (Ck) increments by one unit each memory address, by writing the value zero to memory up to the final value, equal to $2^v-1$, of the counting unit (3), which delivers at this moment an output signal (F) connected to the initializing unit (6) that, in the following cycle, increments a last time the counting unit (3), which returns to zero and de-validates its output signal (tWr), thereby finalizing the initialization cycle.

Figure 6:
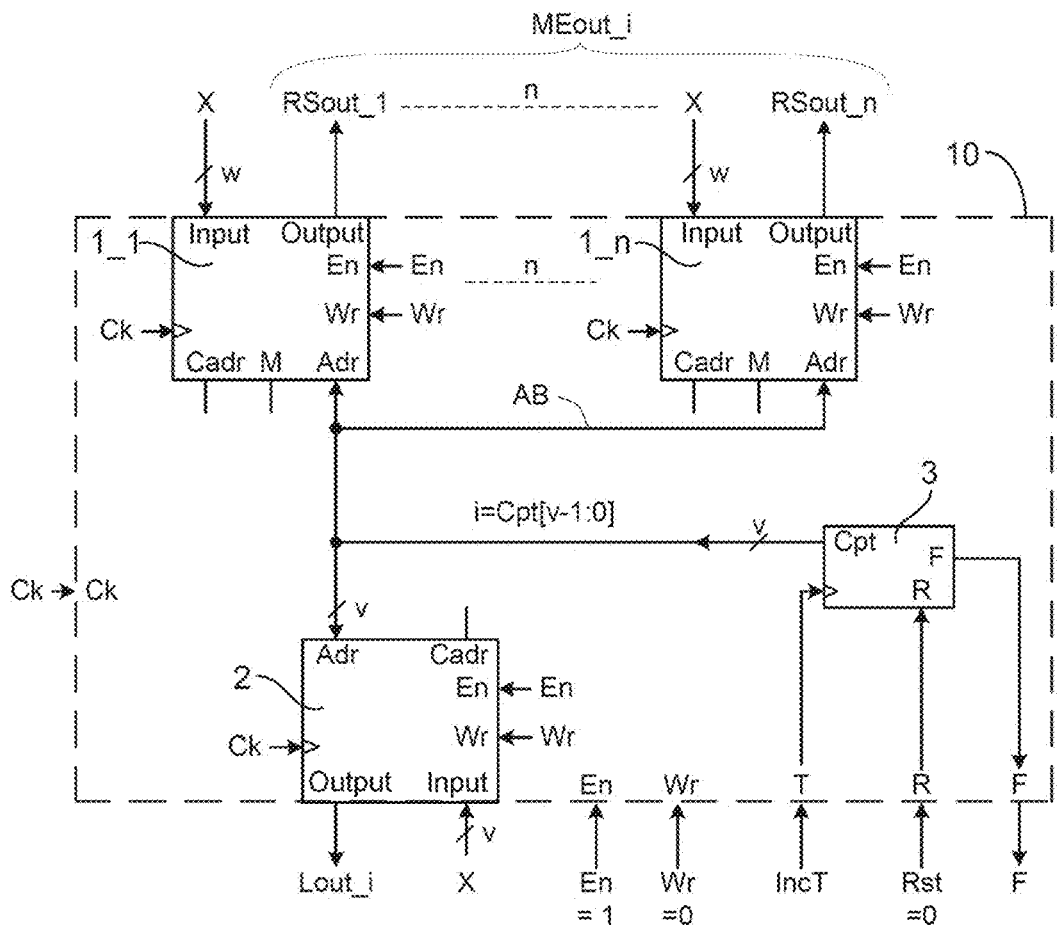

FIG. 6 details the knowledge-transfer mode for transferring knowledge from an associative-memory unit (10) to an external unit. The internal organization of this unit (10) corresponds to that illustrated in FIG. 2, with the exception of the binary signal (Wr), which is invalid, and of an external-transfer binary signal (IncT), which is connected to the incrementing input of the counting unit (3). All the memory sub-units (1_1) to (1_n) and (2) are in read mode and respectively validate on their output ports (Out) the sub-messages (RSout_1) to (RSout_n) corresponding to the message (MEout_i) and (Lout_i) accessible to the exterior of the associative-memory unit (10). The transfer mode starts with an initialization to zero of the counting unit (3), achieved by validating the external binary signal (Rst) during a short instant, then the external-transfer signal (IncT) is activated and deactivated by read cycle. In each read cycle, a pair consisting of a message (MEout_i) and label (Lout_i) is read, a pair equaling zero indicating the end of the transfer.

Figure 7:
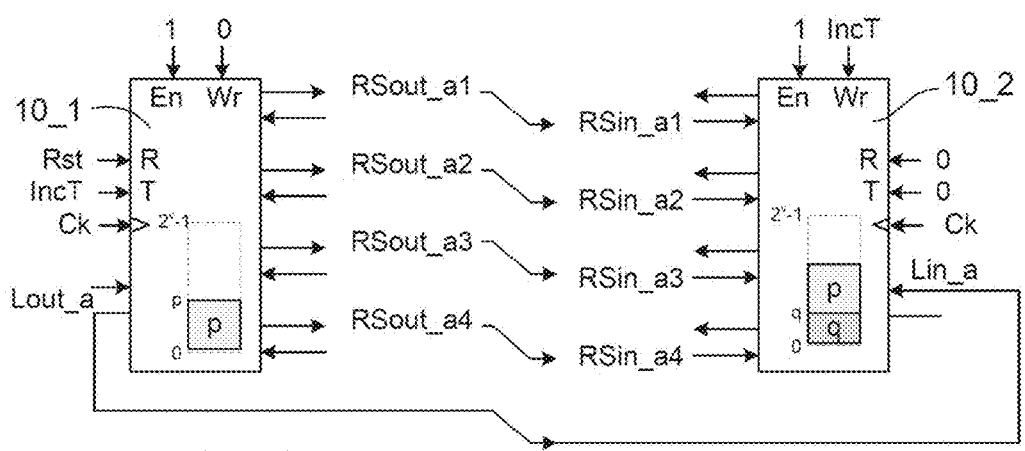

FIG. 7 shows a transfer of knowledge consisting of p information items from an associative-memory unit (10_1) to an associative-memory unit (10_2) possessing knowledge of q information items. Outputs that deliver the sub-messages (Rsout_a1) to (Rsout_a4) and label (Lout_a) of the first associative-memory unit (10_1) are respectively connected to inputs that receive the sub-messages (Rsin_a1) to (Rsin_a4) and label (Lin_a) of the second associative-memory unit (10_2). The valid (=1) signal (En) connected to the two units (10_1) and (10_2) validates these units. A short validation of the binary signal (Rst) of the unit (10_1) initializes to zero the internal counter (3). The transfer signal (IncT) is connected to the input (T) of the first input (10_1) and to the input (Wr) of the second unit (10_2). The inputs (Wr) of the first unit (10_1) and (R), (T) of the second unit (10_2) are set to zero (invalid). The sequencing clock (Ck) is connected to the two units (10_1) and (10_2). Next, the external-transfer signal (IncT) is activated and deactivated by read cycle. In each read cycle, a pair consisting of a message (MEout_i) and label (Lout_i) is transferred from the unit (10_1) to (10_2), a pair equaling zero indicating the end of the transfer. At the end of transfer, the associative-memory unit (10_2) contains p+q message-label pairs. Each unit (10_1) and (10_2) once again becomes free to store a new pair in memory, the first after p storages, the second after p+q storages.

Figure 8:
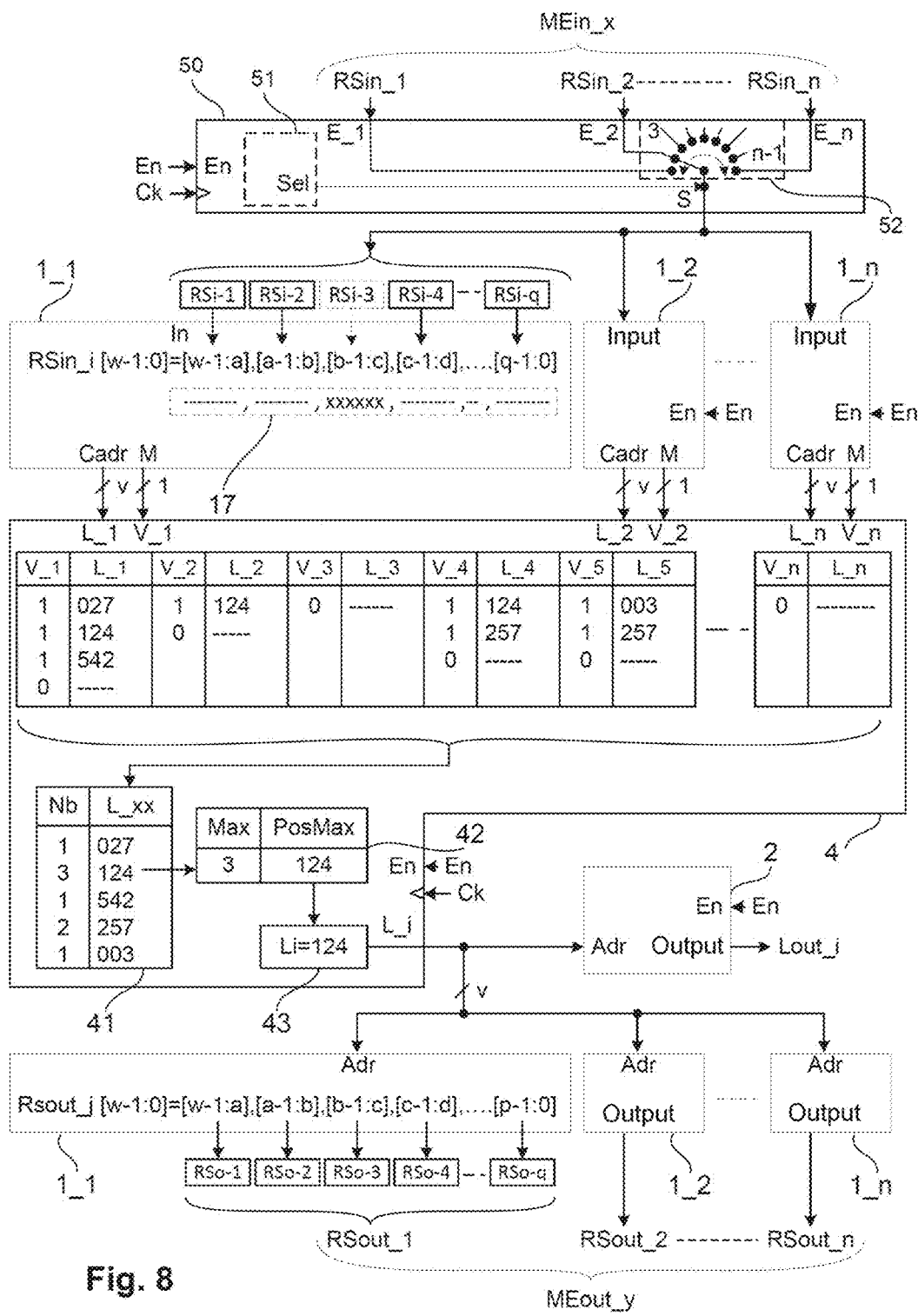

FIG. 8 details the organization of the fed message, the computation of the maximum likelihood therefor and the choice of the label associated on output. For greater clarity, the valid validating binary signal (En) and the sequencing clock (Ck) of the associative-memory unit (10) have not been shown.

An input message (MEin_x) is composed of one or more (n) sub-messages that are each (w) bits in size, the sub-messages of this input message being referenced (RSin_1) to (RSin_n). These sub-messages are not necessarily ordered. For example, the sub-message (RSin_1) may be placed in another position when it is learnt: a position-choosing unit (50) will sequentially place as output each of the sub-messages from 1 to n. When the command signal (En) is validated, the sequencing clock controls a sequencing unit (51) that commands a multiplexing unit (52) of n inputs of w bits that are each connected to one input sub-message (RSin_1) to (RSin_n), and the output of which is connected to all the inputs (In) of the memories sub-units (1_1) to (1_n).

All the sub-messages are organized into a word of w bits that is segmented into q elements of w/q bits (integer division) referenced (RSi-1) to (RSi-q) corresponding to the position of the bits [w-1:a] for (RSi-1), [a-1:b] for (RSi-2), etc. up to [q-1:0]. Each element of w/q bits corresponds to a referenced entity. In the case where this element is poorly referenced or absent, for example the sub message (RSi-3) in position [b-1:c], the TCAM mode (17) allows this portion to be positioned at xxxx (it will always be validated).

Each memory sub-unit (1_1) to (1_n) thus verifies the presence or absence of the sub-messages (RSin_1) to (RSin_n). In the case of presence, the memory sub-unit positions on its output port (Cadr) the address of the memory content and validates its binary signal (M). The unit (4) for computing likelihood receives, on its input (L_1) the content of the output port (Cadr) of the memory sub-unit (1_1) and on its input (V_1) the validating binary output (M) of the same memory sub-unit. The same goes for the connections of the other memory sub-units (1_2) to (1_n) (same index as the aforementioned outputs and inputs). The process of choice d of the maximum likelihood implemented in the unit (4) is explained via the following example:

The input message MEin_x is composed of the sub-messages (RSin_1) to (RSin_n), which are sequenced one after the other by the unit (50). At the end of n sequences, the unit (4) has received, from each memory sub-unit (1_1) to (1_n) respectively the associated data (V_1), (L_1) to (V_n), (L_n) presented in the table below:

| V_1 | L_1 | V_2 | L_2 | V_3 | L_3 | V_4 | L_4 | V_5 | L_5 | — | V_n | L_n |
|---|---|---|---|---|---|---|---|---|---|---|---|---|
| 1 | 027 | 1 | 124 | 0 | — | 1 | 124 | 1 | 003 | | 0 | — |
| 1 | 124 | 0 | — | | | 1 | 257 | 1 | 257 | — | | |
| 1 | 542 | | | | | 0 | — | 0 | — | | | |
| 0 | — | | | | | | | | | | | |

During this sequence of procession of the n sub-messages, the memory sub-unit (1_1) found three present memory contents the addresses 027, 124 and 542 of which were presented to the input (L_1) and validated by (V_1) of the unit (4). The invalidation of (V_1) indicates that the data presented on the input (L_1) will not be taken into account. In the same way, the memory sub-unit (1_2) found a present memory content the address 124 of which was presented to the input (L_2) and validated by (V_2) of the unit (4). Respectively, the memory sub-unit (1_3) delivered nothing, the memory sub-unit (1_4) delivered two data 124 and 257, the memory sub-unit (1_5) delivered two data 003 and 257, and the following memory sub-units up to (1_n) delivered nothing. A sub-unit (41) of the unit (4) counts the number of times that an input datum is present, namely, in this example, the datum 121 is present once, the datum 124 three times, 542 once, 257 two times and 003 once. The sub-unit (42) selects the most represented datum, i.e. in this example the datum 124 present a maximum of 3 times, and transmits it to the register (43) that represents the datum positioned on the output port (Li) of the unit (4), which is in communication with a v-bit bus that itself is connected to the input ports (Adr) of all the memory sub-units (1_1) to (1_n) and (2). The memory sub-units (1_1) to (1_n) deliver, to their respective output port (out), the sub-messages (RSout_1) to (RSout_n) representing the output message (MEout_y) all the elements of the sub-messages of which are corrected (corresponding to the pattern learnt precedingly).

In the case where the sub-unit (41) of the unit (4) arbitrarily finds two separate data of equivalent quantity, it is the most reliable datum that is chosen. The visual perception of an indecipherable figure such as the impossible trident of Norman Mingo is an example.

Figure 9:
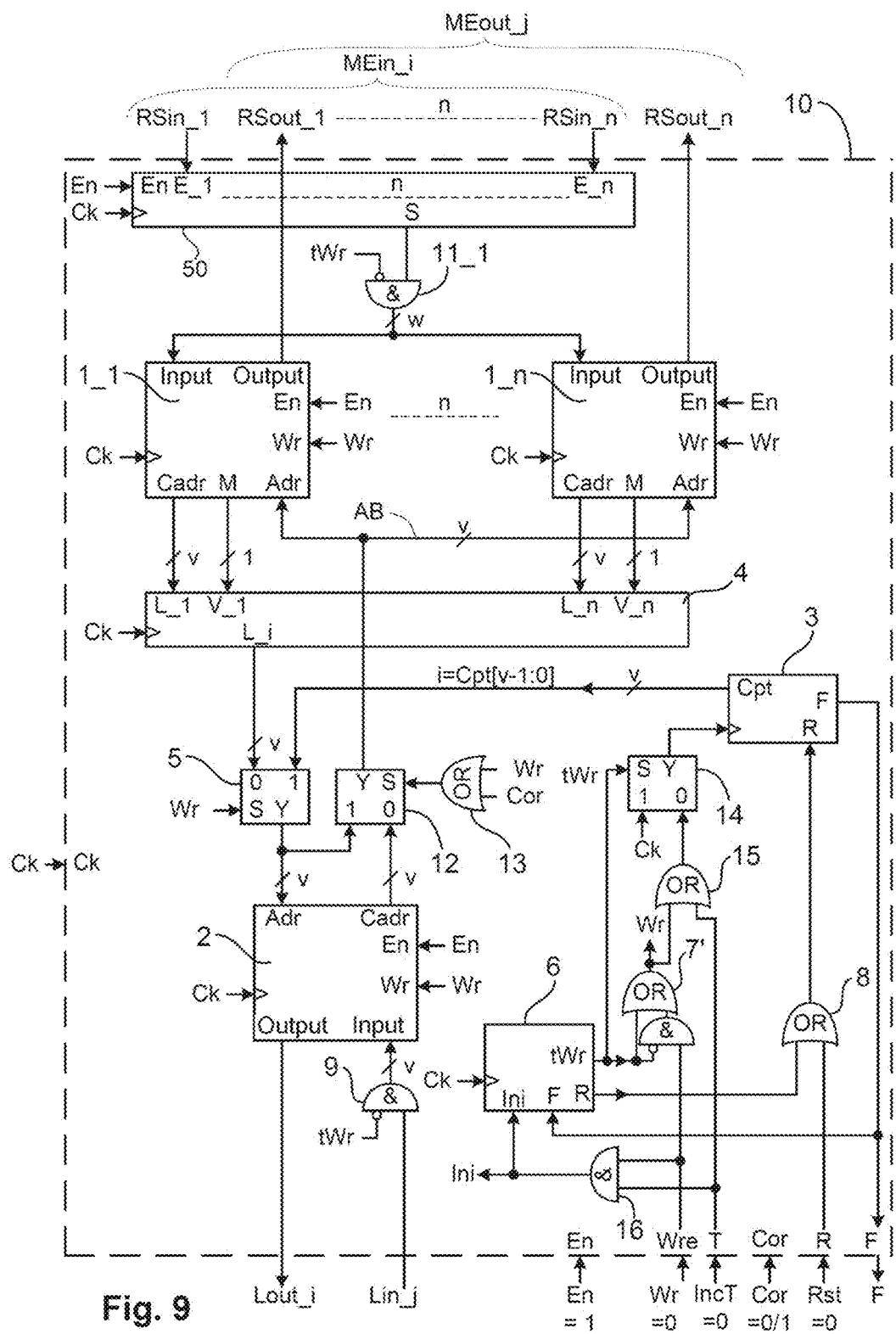

FIG. 9 details the operation of the associative-memory unit (10) integrating the various modes described above, namely a passive mode (stoppage of the various functions), a read mode (described with reference to FIG. 4), a transfer mode (described with reference to FIG. 6) a write mode (described with reference to FIG. 2) and an initiation mode (described with reference to FIG. 5). The table below gives the correspondence between the value of the signals (En), (Wr) and (T) of the command bus and the selected operating mode:

| Command bus | mode | | |
|---|---|---|---|
| | En | Wre | T |
| Stoppage | 0 | X | X |
| Read | 1 | 0 | 0 |
| Transfer | 1 | 0 | 1 |
| Write | 1 | 1 | 0 |
| Initialization | 1 | 1 | 1 |

To group together the various operating modes requires certain modifications to be made to the associative memory unit (10) described above with reference to FIGS. 1 to 6.

The value Cpt[v-1;0] delivered by the counting unit (3) is passed to one of the two inputs of the multiplexing unit (5), the second input being delivered by the v-bit output (L_i) of the unit (4) for computing maximum likelihood. The selection (S) of the unit (5) is controlled by the binary signal (Wr), the output (Y) of this unit (5) corresponding to the value of (Cpt) when the binary signal (Wr) is valid and to the value of (L_i) in the contrary case. The output (Y) of this unit (5) is connected to the input port (In) of the memory sub-unit (2) and to one of the two inputs of a second multiplexer (12), the second input of this multiplexer (12) being connected to the output port (Cadr) of the memory sub-unit (2). The selection (S) of the unit (12) is controlled by the output of a "OR" logic unit (13) with two inputs, which receives the binary signals (Wr) and (Cor) respectively on each of its inputs. The output (Y) of the multiplexer (12) is connected to the input port (Adr) of each memory sub-unit (1_1) to (1_n).

The "OR" logic unit (7), which performed the Boolean function Wr=tWr+Wre, has been replaced by the "OR-AND" logic unit (7') that performs the Boolean function Wr=tWr+Wre.t$\overline{Wr}$, with the same connections as for the unit (7).

The input signal (Wr) of the multiplexer (14) has been replaced with a connection to the output of the "OR" logic unit (15) with two inputs, which receives the binary signals (Wr) and (T) respectively on each of its inputs.

The binary signal for commanding the initialization mode (Ini) is generated by an "AND" logic unit (16) with two inputs, which receives the binary signals (Wre) and (T) respectively on each of its inputs.

Figure 10:
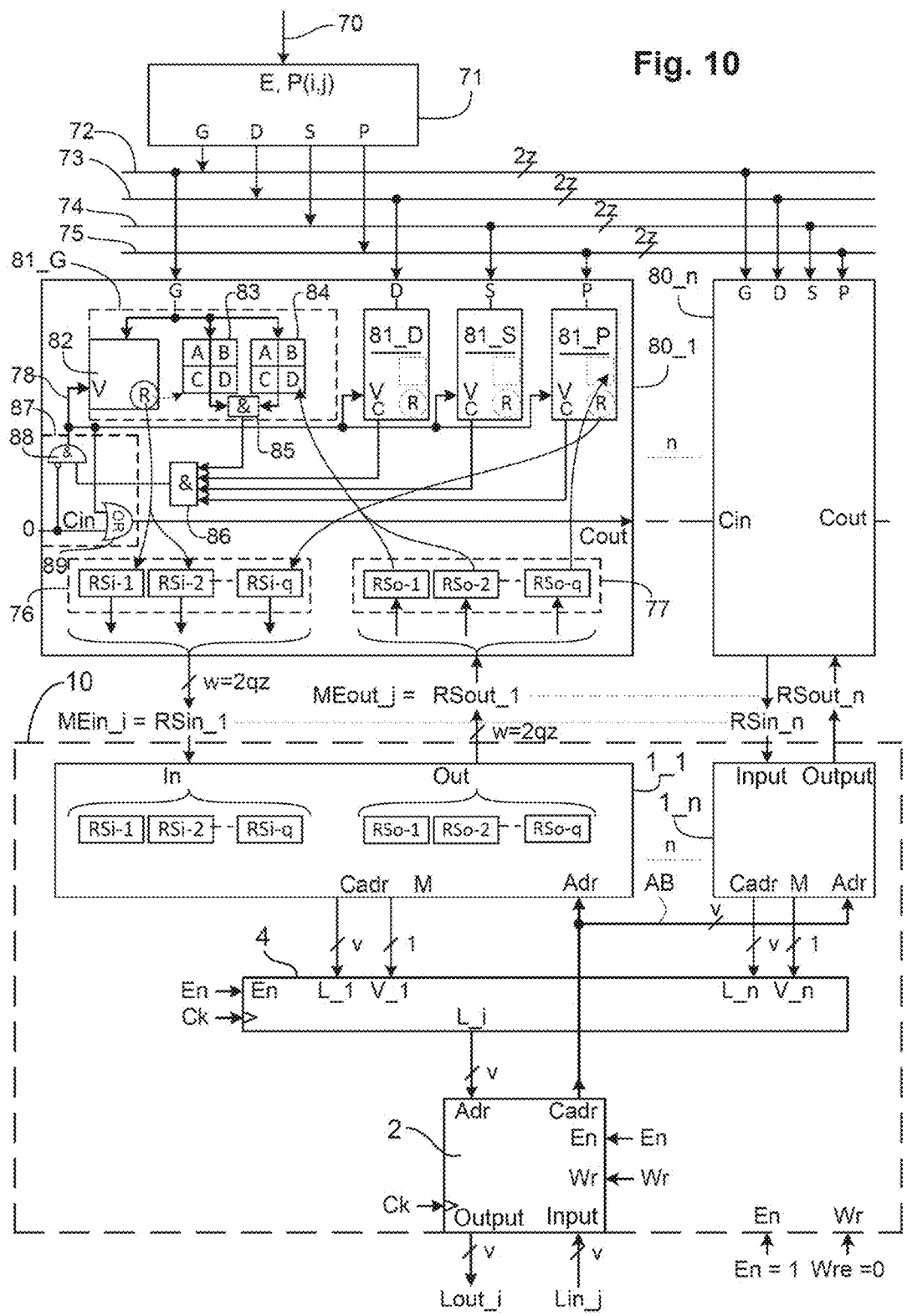

FIG. 10 illustrates an example of use of the associated memory (10) in combination with dynamic-attractor units (80_i) and with a linguistic-translation-transferring unit (71). For greater clarity, the sequencing signals have been omitted.

The Linguistic-Translation-Transferring Unit (71).

Spatial-temporal data (70) generated by an upstream element (not shown here) are delivered to the input port (E, P(i,j)) of a linguistic-translation-transferring unit (71) that in turn delivers, synchronously, at a rate set by a clock signal (Ck), position-referenced elementary semantic representations to its output ports G, D, S, and P. Each output port G, D, S and P is independently and respectively connected to the bus G (72), the bus D (73), the bus S (74) and the bus P (75), which are of identical 2z-bit size. The n dynamic-attractor units (80_1) to (80_n) are connected to these four buses, via an input port G, D, S and P, respectively.

The Dynamic-Attractor Unit (80_1)

Since all the dynamic-attractor units (80_1) to (80_n) are identical, only the dynamic-attractor unit (80_1) is described in more detail, with a view to giving an explanation of the operation thereof. This dynamic-attractor units (80_1) includes:

four identical statistical processing units (81_G), (81_D), (81_S), and (81_P). Each statistical processing unit (81_x) comprises:
  a unit for computing a bilinear histograms (82), comprising
    an input datum (x) corresponding to G or D or S or P depending on the statistical processing unit (81_x),
    a result-register unit (R),
    an input (V) for validating the bilinear-histogram computation, and
    a unit (not shown here) for sequencing, depending on the operating mode, either by sequence or by number of events, that ensures, cyclically in sequence, the initialization phase, the histogram-computation phase, the phase of register (R) update and the automatic classification phase.

The initialization phase consists in zeroing the memory for storing the histogram computations and in initializing the various computation registers.

During the histogram-computation phase, to each presented datum (x) corresponds an input signal (V) that validates or not the computation.

At the end of the sequence or once the maximum value of the histogram exceeds an externally parameterized threshold that depends on the mode used, the registers (R) and the registers of the automatic classifying unit (83) are brought up to date. The computed values include the computation number NBPTS, the median Med, the value of the maximum RMAX, its position PosRMX and the classification limits A, B, C, and D.

two classifying units, one automatic (83) and one request-based (84), each receive data of 2z bits from the input port (x) and deliver a valid classification binary signal if it is comprised between its classification limits: A and B for the z most significant bits and C and D for the z least significant bits.

a Boolean classification-validating unit (85) receives the binary classification signals from the two, automatic and request-based, classifying units (83, 84).

The result of the AND logic operation performed on these two binary classification signals is transmitted out of the statistical processing unit (81_x).

A Boolean spatially-temporally classifying unit (86) receives the binary classification signals from the four statistical processing units (81_G), (81_D), (81_S) and (81_P) in order to perform thereon an AND logic operation the result of which is transmitted to the histogram-computation-validating unit (87).

A histogram-computation-validating unit (87) comprises an AND logic unit with two inputs one of which (88) is inverted and an OR logic unit with two inputs (89). The AND logic unit (88) receives the binary signal output from the AND logic unit (86) directly and inverts the input binary signal (Cin) of the unit (80_1) and delivers a binary histogram-computation-validation signal to the input (V) of each statistical processing unit (81_G), (81_D), (81_S) and (81_F).

The OR logic unit (89) receives the input binary signal (Cin) of the unit (80_1) and the binary histogram-computation-validation signal from the AND logic unit (88) and delivers a binary inhibition signal to the output port (Cout) of the unit (80_1).

An output-register unit (76) comprises the registers (RSi-1) to (RSi-q), which are updated each time the value NBPTS exceeds an externally parameterized threshold. The order of the registers (RSi-1) to (RSi-q) corresponds to the median values (Med$_1$, Med$_2$) and to the classification range (P$_1$, P$_2$) defined by the difference between the classification limits B-A and D-C for each statistical processing unit (81_G), (81_D), (81_S) and (81_P). Namely, for (RSi-1) and (RSi-2), the medians (MedG$_1$, MedG$_2$) of the global mode and their respective ranges (PG$_1$, PG$_2$), respectively, and likewise for the dynamic mode and structural mode, and their position, (MedP$_1$, MedF$_2$) corresponding to the energy centroid and (PP$_1$, PP$_2$) to its extent. In this example, the output-register unit (76) comprises registers (RSi-1) to (RSi-q). In general, a certain number of registers (RSi-x) are not exploited because irrelevant. For example, the visual perception of a text possesses a uniform global mode (same colors and no movement) only the structural aspect provides relevant information. Of eight starting registers, there remain only three: centroid, dimension and structure.

An input-register unit (77) comprises registers (RSo-1) to (RSo-q) having the same organization as that of the output-register unit (76). Namely, for (RSo-1) to (RSo-q) respectively the medians (MedG$_1$, MedG$_2$) of the global mode and their respective ranges (PG$_1$, PG$_2$), which are transformed into classification limits A, B, C, D such that the limit A is equal to MedG$_1$-PG$_1$/2, the limit B to MedG$_2$+PG$_2$/2, and likewise for the limits C and D in the same order. These classification limits A, B, C, D are written to the request-based classifying unit (84). The same operation is repeated for the other request-based classifying units (84) of the units (81_D), (81_S) and (81_P). For information containing z bits more than four bits, it is preferable to extend the classification range by decreasing the lower classification limit by a value of 1 to 2 bits and by increasing the upper classification limit by a value of 1 to 2 bits in order to enlarge the request.

The Associative Memory (10)

The associative-memory unit (10), illustrated in the preceding figures, in its generic implementation, has as interface with the dynamic-attractor units (80_1) to (80_n) the message (MEin_i), which is formed from n sub-messages (RSin_1) to (RSin_n), and the message (MEout_j), which is formed from n sub-messages (RSout_1) to (RSout_n).

The sub-message (RSin_1) is transmitted from the output-register unit (76) of the dynamic-attractor unit (80_1) to the input port (In) of the memory sub-unit (2_1) of the associative-memory unit (10). Likewise, the sub-message (RSin_2) is transmitted from the output-register unit (76) of the dynamic-attractor unit (80_2) to the input port (In) of the memory sub-unit (1_2) of the associative-memory unit (10), and the transmission continues in the same order up to the rank n.

Conversely, the sub-message (RSout_1) is transmitted from the output port (Out) of the memory sub-unit (1_1) of the associative-memory unit (10) to the input-register unit (77) of the dynamic-attractor unit (80_1). Likewise, the sub-message (RSout_2) is transmitted from the output port (Out) of the memory sub-unit (1_2) of the associative-memory unit (10) to the input-register unit (77) of the dynamic-attractor unit (80_2), and the transmission continues in the same order up to the rank n.

The associative-memory unit (10) comprises:
a first assembly composed of n memory sub-units, each composed of $2^w$ words of w bits, said sub-units being referenced (1_1) to (1_n) and each receiving, via their input port (In) respectively the sub-message (RSin_1) for the memory sub-unit (1_1) to sub-message (RSin_n) for the memory sub-unit (1_n),
a second assembly is composed of a memory sub-unit of $2^v$ words of v bits (2) that receives, via the input port (In), the label (Lint), and
a unit (4) for computing maximum likelihood in order to select the most represented value i, k, etc. This unit (4) receives, from the output port (Cadr) of each memory sub-unit (1_1) to (1_n) a value i, or otherwise k, respectively via an input port (L_i) to (L_n) with their respective validation binary signal via the input (V_1) to (V_n), respectively. Internal sequencing is assured via a clock signal (CK) introduced into the unit (4). The choice of the maximum likelihood is positioned on the output port (L_i), a bus of v bits transmitting this value to the input port (Adr) of the memory sub-unit (2), which delivers, via its output port (Out), the value of the label (Lout_i).

In the label-to-message direction, the method is identical to that illustrated in FIG. 3. The arrival of (Lin_j) at the input port (In) of the memory sub-unit (2) causes the value j to be delivered to its output port (Cadr), this value j being transmitted to the bus AB through a link-value choosing unit (5) and fed to all the memory sub-units (1_1) to (1_n), which each deliver, via their respective output ports (Out), the respective sub-messages (RSout_1) to (RSout_n) that together form the message (MEout_j).

In the opposite direction, i.e. the message-to-label direction, the sub-messages (RSin_1) to (RSin_n), corresponding to the message (MEin_i), are respectively fed to the input port (In) of each memory sub-unit (1_1) to (1_n), which each deliver a value i, or otherwise k to their respective output ports (Cadr) in association with a binary validation signal that is delivered, via the output (M) of the same memory sub-unit. In the case where the fed sub-message is absent from the memory sub-unit, the latter delivers, to its output (M), a binary invalidation signal, the value present on its output port (Cadr) then being ignored.

Decomposition of the Messages.

Each received message (MEin) of n.w bits is composed of n sub-messages (RSin_x) of w bits, x varying from 1 to n. Likewise, each message (MEout) of n.w bits delivered by the associative memory is composed of n sub-messages (RSout_x) of w bits, x varying from 1 to n.

Each sub-message is divided into q input elements (RSi_x) or output elements (RSo_x) of z bits corresponding to w/q bits the rank of the element of which corresponds to a notion of position, dimensions and characterization.

The position is defined by its coordinate system (Ref), which generally varies from one to three, and is often equal to two for a pair of elements, for example x and y representing a relationship between two distances in the coordinate system (Ref), or t and f representing a relationship between time and frequency in the coordinate system (Ref). Generally, it is the position of the centroid of the data cloud representing the above characterization, i.e. as defined by the elements of the sub-message.

The dimensions characterize the extent of the data cloud, generally its size, therefore one element (RSi_x), for each of the axes of the coordinate system (Ref).

The characterization is generally an elementary semantic representation of one of the following types:
Global: by way of nonlimiting example, a color is defined by a hue and a saturation, a child channel is defined by a fundamental, etc.
Dynamic: by way of nonlimiting example, a movement is defined by its speed and its orientation, the same goes for the prosody of a voice, etc.
Structural: by way of nonlimiting example, an edge is defined by its orientation and its curvature, a phoneme is defined by the distribution of its formants over time, etc.

The label is composed of a word of v bits, the quantity of labels storable in memory is $2^v-1$, the label "zero" being excluded.

The definition of the label is given by the input message, which may be incomplete and/or erroneous, this making it difficult to find the label. The use of a ternary mode on certain elements (RSi_x), corresponding to masking of a bit field applied to one portion of the input message (17) of (RSin_i), allows this problem to be solved.

FIG. 11-a explains the operation of the linguistic-translation-transferring unit (71) on the basis of spatial-temporal data (70) (temporal data E and positioned data P(i,j)) generated by an external sensor (not shown). Each spatial-temporal datum (70) input into this unit (71) is linguistically translated and delivered to four output ports, synchronously via a signal Ck, in three distinct elementary semantic representations G, D, S, positioned at P. Each output port G, D, S, and P is independently and respectively connected to the bus G (72), the bus D (73), the bus S (74) and the bus P (75).

FIG. 11-*b* is a schematic representation of the various data G, D, S, and P. The input datum is shown in its output global mode G, its output dynamic mode D and its output structural mode S, and in position i, j, which is determined by the datum P, in three registered planes in 2D mode. The position P is expressed as a function of the dimension of its basis. The latter is generally 2D for visual data (x, y) or auditory data (t, f), but it may of course be 3D or reduced to 1D.

FIG. 12 illustrates the organization of the results of the computations of the four bilinear histograms of the dynamic-attractor unit (80_*i*) on the basis of the data G, D, S, and P of 2z bits output from the linguistic-translation-transferring unit (71). The input datum processed in this example is of 2D-vision type. The unit (71) linguistically translates this datum into:

- a global representation (G): along two axes, hue (T) and saturation (S). Histogram (H_G) over $2^{2z}$ values, FIG. 12*a*.
- a dynamic representation (D): along two axes, direction (Dir) and speed of movement (Vit). Histogram (H_D) over $2^{2z}$ values, FIG. 12*b*.
- a structural representation (S): along two axes, oriented edge (Bo) and curvature (Cb). Histogram (H_S) over $2^{2z}$ values, FIG. 12*c*.
- a positionwise representation (P): along two axes x and y. Histogram (H_P) over $2^{2z}$ values, FIG. 12*d*.

Each input datum is coded into a word of 2z bits giving a $2^z \times 2^z$ matrix representation of the histogram computation, the first z bits representing one axis and the remaining z bits the second axis of the matrix.

To illustrate the perceptual method of representing elementary semantic representations, the representation in position (P) of one edge segment of an object (Ob) is shown in FIG. 12*d*, values shaded grey corresponding to the classified results (classified by the classifying unit (83)) of the bilinear-histogram computation of the matrix (H_P). The result of this histogram computation is transmitted to the output-register unit (76), the value thereof being its positionwise centroid of 2z bits (x, y) and its dimensional range of 2z bits (a, b).

The perceived orientation and local curvature of the object (Ob) (FIG. 12*c*) is delivered by the bilinear-histogram computation (H_S) the result of the computation of which is transmitted to the output-register unit (76) with, as value, its centroid, and therefore its semantic orientation and curvature representation of 2z bits (bo, cb) and its tolerance of 2 bits (a, b).

FIG. 12*a* indicates, via the result of the bilinear-histogram computation (H_G), the dominant color of the portion of the object (Ob) which is represented by its hue and saturation value of 2z bits (t, s) with its tolerance value of 2z bits (a, b), which is transmitted to the output-register unit (76).

Likewise, FIG. 12*b* indicates, via the result of the bilinear-histogram computation (H_D), the local movement of the portion of the object (Ob), which movement is represented by its direction-of-movement value and its speed over 2z bits (t, s) with its tolerance value of 2z bits (a, b), which is transmitted to the output-register unit (76).

Conversely, the input-register unit (77) brings up to date, in the same order, the classification limits of the request-based classifying units (84) of each statistical processing unit (81_G, 81_D, 81_S, and 81_F).

This perceptual method ensures an automatic control between the perceived data, which are represented and interpreted by way of a learnt label.

In this example application, the input sub-message (RSin_x) of the associative memory (10) is composed of the results (t, s, a, b) for the sub-message (RSi-1) and (RSi-2), (dir, vit, a, b) for the sub-message (RSi-3) and (RSi-4), (bo, cb, a, b) for the sub-message (RSi-5) and (RSi-6), and (x, y, a, b) for the sub-message (RSi-7) and (RSi-8). Likewise for the output sub-message (RSout_x) of the associative memory (10).

This sub-message (RSin_x) is a positioned global, dynamic or structural elementary semantic representation. The n sub-messages (RSin_x), x varying from 1 to n, define the message MEin_i representing, as output from the associative memory (10), the label (Lout_i).

Figure 13:
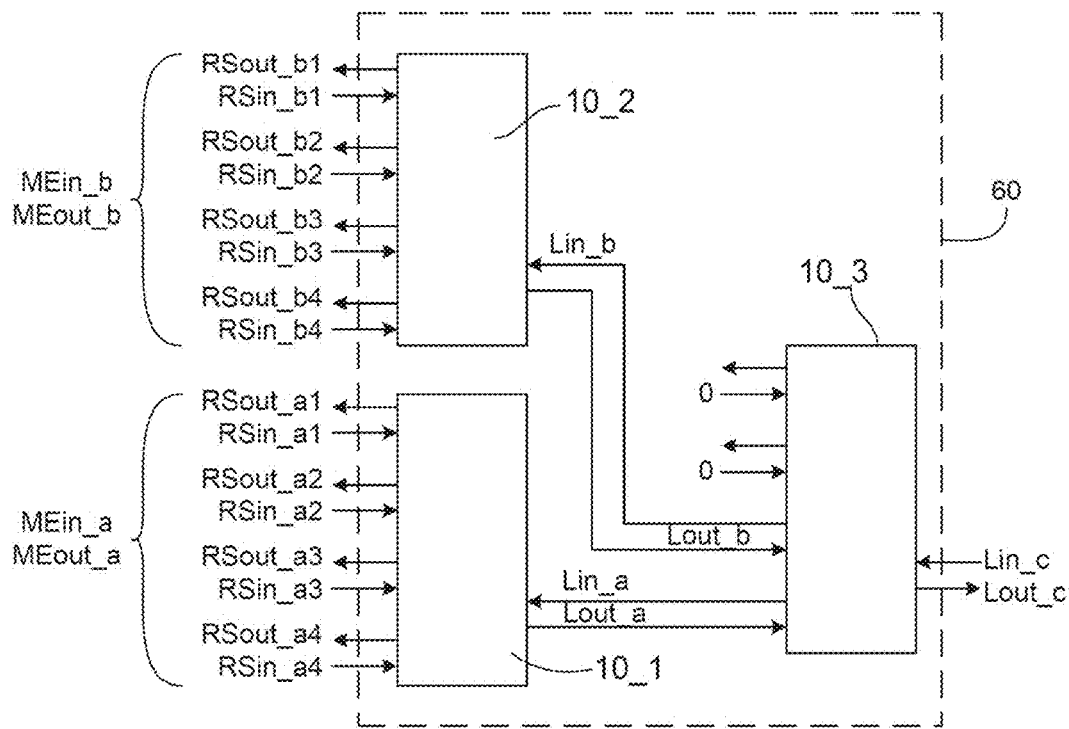

FIG. 13 shows the use of three associative-memory units (10_1) to (10_3) grouped together into a set (60) associating messages versus label and vice versa, the message of each thereof being organized into four sub-messages, each of said associative-memory units being assembled into two hierarchical levels associating, in parallel, two input messages (MEin_a) and (MEin_b) with one output label (Lout_c) and one input label (Lin_c) with two output messages (MEout_a) and (MEout_b). The message (MEin_a) input into the unit (10_1) is composed of four sub-messages (RSin_a1) to (RSin_a4), and likewise the message (MEout_a) output from the unit (10_1) is composed of four sub-messages (RSout_a1) to (RSout_a4). The unit (10_2) possesses the same configuration as the unit (10_1), the index a been replaced by b. The labels (Lout_a) and (Lout_b) form the message input into the unit (10_3), and likewise the input labels (Lin_a) and (Lin_b) form the message output from the unit (10_3). This unit (10_3) associates its input label (Lin-c) with the output message, which consists of the sub-messages (Lin_a) and (Lin_b), and its output label (Lout-c) with the input message, which consists of the sub-messages (Lout_a) and (Lout_b). The sub-messages not present on the input of the unit (10_3) are represented by the value zero.

This arrangement of the three associative-memory units (10_1) to (10_3) allows the messages (MEin_a) and (MEin_b) to be associated with the label (Lout_c) and vice versa the messages (MEout_a) and (MEout_b) with the label (Lin_c).

This arrangement is nonlimiting, it may be extended numberwise to more than three associative-memory units (10_1) to (10_*x*) grouped together in a plurality of hierarchical levels, the size of the messages in the number of sub-messages varying accordingly. These trees allow complex and varied training routines with a small number of associative-memory units (10_1) to (10_*x*).

For example, a message (A) representing the numeral one and a message (B) representing the numeral zero are respectively associated with the associative-memory unit (10_1) and the associative-memory unit (10_2), these units respectively delivering the labels "one" and "zero", which form the new message for an associative-memory unit (10_3) that delivers a label "ten". In the opposite direction, the label "ten" generates a message containing two sub-messages of label "one" and "zero" that are respectively introduced into the associative-memory units (10_1) and (10_2) and that respectively generate elementary representations of the numerals "one" and "zero", an erroneous-message portion being corrected.

Likewise, with this organization, a message 1 associates a (sound) with one associative-memory unit (10_1), and a message 2 associates a (white bird) with one associative-memory unit (10_2), the third associative-memory unit (10_3) associating the label "seagull". Conversely, when the sound specific to a seagull is heard it is perceived as elementary semantic representations described by the message 1, which is introduced into the associative-memory unit (10_1), a sound label thereby being delivered to the associative-memory unit (10_3), its maximum-likelihood unit (3) deducing the label "seagull" therefrom. Returnwise, the same associative-memory unit (10_3) generates the message (sound) and (white bird). The white-bird sub-message is introduced by way of label into the associative-memory unit (10_2), which deduces therefrom a message of elementary semantic representations corresponding to the description of this white bird in order to locate it.

Figure 14:
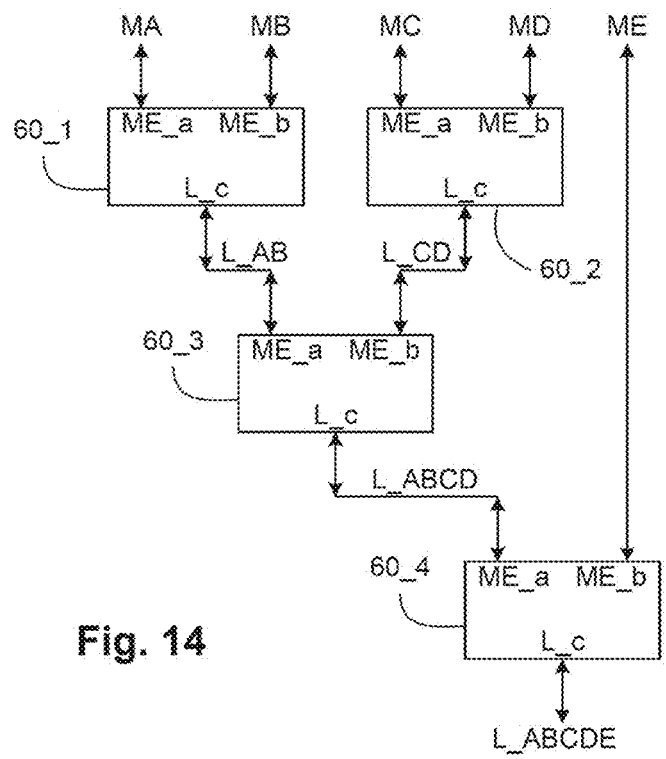

FIG. 14 shows an extension and generalization of the use of a plurality of sets associating messages versus label and vice versa to a universal hierarchical-graph generator (60). For greater clarity, the command binary signals (En), (Wr), (T), (Cor), and the sequencing clock (Ck) used to manage all of the associative memories (10) of these sets (60) have not been shown.

A first message-associating set (60_1) associates two messages (A) and (B) with one label (L_AB) and vice versa. A second message-associating set (60_2) associates two messages (C) and (D) with one label (LCD) and vice versa. A third message-associating set (60_3) associates the two labels defined beforehand, by way of messages (L_AB) and (L_CD), with one label (L_ABCD) and vice versa. A fourth message-associating set (60_4) associates the label defined beforehand by way of message (L_ABCD) and the message (E), with a label (L_ABCDE) and vice versa.

FIG. 15 illustrates a robotic-type mode of use. A stimulus (91) is perceived by a receiver (92) that then transmits, via its output port (Mes), an afferent message (93) to the associative-memory unit (10_1), via its input (MEin), leading on its output (Lout) to a perceived label (94). An analyzing process (not shown here) deduces therefrom, depending on the application, a command label (95) that is delivered to the input port (Lin) of the associative memory (10_1). The latter then delivers, to its output port (MEout) an efferent signal (96), which is passed to the input port (Cde) of the effective unit (97), which gives the response (98).

Figure 16:
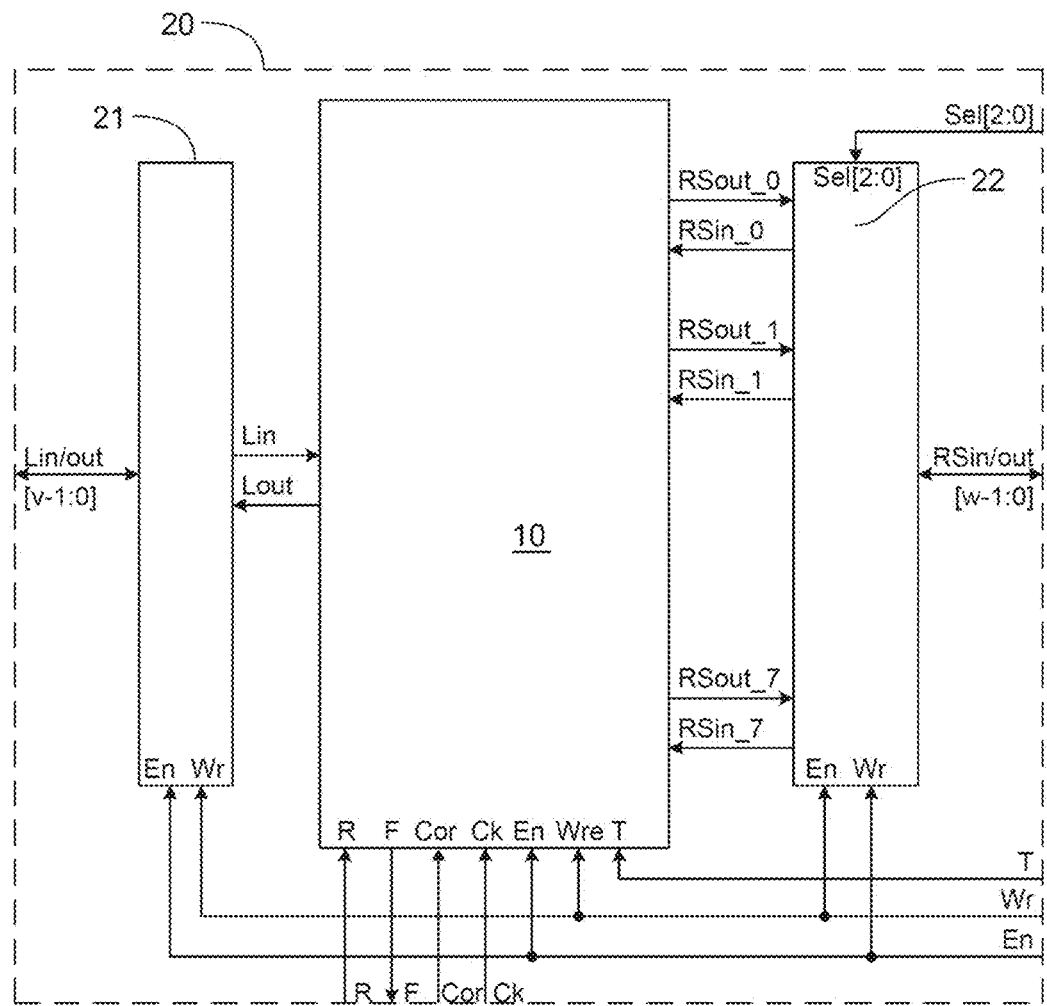

FIG. 16 shows an electronic component (20) incorporating the associative memory (10). In order to decrease the number of circuit pads, the following have been associated:

An interface unit (21) for communication between the input/outputs (Lin/Lout) of the associative memory and the bidirectional port (Lin/Lout) of the electronic component controlled via the signal (En) and (Wr).

An interface (22) for communication between the input/outputs (RSin_i/RSout_i) of the associative memory, which are selected via the signals (Sel[2:0]), and the bidirectional port (RSin/RSout) of the electronic component.

Command signals: (En), (Wr), (T), (R), (F), (Cor), (Ck), and (Sel[2:0]).

Employing as bus size: v=16 and w=24, the package has 56 pads, this being very compact. Setting n to 8, the memory volume is made up of 8 units of $2^{16}$ words of 24 bits and one memory unit of $2^{16}$ words of 16 bits, i.e. a total of 13 631 488 memory cells. One elementary cell is at the present time smaller than one pmt, for example $10F^2$ in 28 nm technology for a ferroelectric cell, this allowing a circuit of less than 15 $mm^2$ to be used for an associative memory of 65 535 labels, which is therefore very economical.

Figure 17:
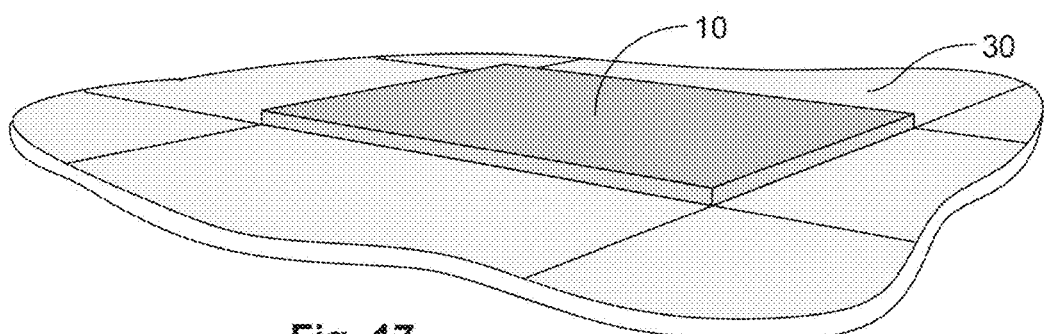

FIG. 17 shows another form of electronic integration, this time directly into the substrate of a wafer (30) already processed with another etch process. This BEOL process (BEOL standing for "back end of line") allows a single component that incorporates both the perceptive and the associative-memory portion to be produced. This is a system-on-chip (SoC). This SoC may be duplicated into a matrix-array of SoCs, in order to allow a plurality of perceptive modalities such as vision, hearing, touch, etc. to be processed in parallel and the perceptive knowledge generated to be increased. This SoC may advantageously be stacked under an image sensor in order to obtain a visual sensor endowed with intelligence. If a transmitting unit is added thereto, all that is required, to achieve a complete working product, is to provide a power supply.

REFERENCE NUMBERS AND SYMBOLS

1_i associative-memory sub-unit (i) of $2^v$ words of w bits
2 associative-memory sub-unit of $2^v$ words of v bits
3 unit for counting $2^v$ values of (Cpt), with zeroing input (R) and count-limit output (F)
4 unit for selecting maximum likelihood
5 a v-bit 2-to-1 multiplexing unit
6 unit for initializing the memory sub-units
7 Boolean OR Boolean unit with 2 inputs
7' Boolean AND-OR Boolean unit with 2 inputs
8 Boolean OR Boolean unit with 2 inputs
9 Boolean AND Boolean unit with 2 inputs one of which is an inverted v-bit input
10 associative-memory unit
11_i Boolean AND Boolean unit (i) with 2 inputs one of which is an inverted w-bit input
12 a v-bit 2-to-1 multiplexing unit
13 Boolean OR Boolean unit with 2 inputs
14 a 1-bit 2-to-1 multiplexing unit
15 Boolean OR Boolean unit with 2 inputs
16 Boolean AND Boolean unit with 2 inputs
17 mask of a bit field applied to one portion of the input message RSin_i
20 electronic component integrating the associative memory (10)
21 interface for communication between the input/outputs Lin/Lout of the associative memory (10) and the electronic component (20)
22 interface for communication between the input/outputs RSin_i/RSout_i of the associative memory (10) and RSin/RSout the electronic component (20)
30 silicon wafer
41 unit for sequencing and quantifying data with search for the most represented datum
42 register for quantifying the most represented datum
43 output value of the unit for selecting maximum likelihood
50 unit for choosing position
51 sequencing unit
52 multiplexing unit with n inputs of w bits
60 universal hierarchical-graph generator
70 spatial-temporal input datum
71 linguistic-translation-transferring unit
72 G bus
73 D bus
74 S bus
75 P bus
76 output-register unit
77 input-register unit
78 binary histogram-computation-validation signal
80 dynamic-attractor unit
81_G, 81_D, 81_S, et 81_P statistical processing units
82 bilinear-histogram-computing unit
83 automatic classifying units
84 request-based classifying units
85 Boolean unit for validating classification
86 Boolean unit for spatial-temporal classification 87 histogram-computation-validating unit
91 stimulus
92 receiver
93 afferent channel
94 perceived label
95 command label
96 efferent channel
97 effector
98 response
AB common v-bit bus
Adr memory address input port of the memory sub-units (1_1) to (1_n) and (2)
Cadr address output port for the memory content selected by the input port (In) of the sub-units (1_1) to (1_n) and (2)
Cin dynamic inhibition input command
Cout dynamic inhibition output command
Ck sequencing clock
Cor command-signal input for the correction of the input message (RSin_i)
Cpt output port of the counting unit (3)
Cpt[v-1:0] binary output value of the counting unit (3)
D dynamic elementary semantic representation
En validation input function of the associative-memory sub-units (1_i) and (2)
F count-limit output signal
G global elementary semantic representation
In input port of the memory sub-units (1_1) to (1_n) and (2)
L_i link value between the memories (1) and (2)
L_AB input and output label
L_CD input and output label
Lout_i label as output
Lin_j label as input
M output signal validating the binary value of the associated output port (Cadr)
MA, MB, MC, MD, ME input and output messages
MEin_i input message grouping together n sub-messages (RSin_1) to (RSin_n)
MEout_j output message grouping together n sub-messages (RSout_1) to (RSout_n)
n number of input or output sub-messages (RSin_i) or (RSout_i)
Ob edge segment of an object
Out output port of the memory sub-units (1_1) to (1_n) and (2)
P position of the elementary semantic representations G, D and S
q number of elements forming a sub-message
R input signal for zeroing the counting unit (3)
S structural elementary semantic representation
Wr signal for controlling the write to the memory sub-units (1) and (2)
Wre input signal for selecting the associative-memory unit (10) to be written to
RSi_x element of the input sub-message RSin_i of z bits
RSo-x element of the output sub-message RSout_i of z bits
RSin_i sub-message (i) in memory input
RSout_i sub-message (i) in memory output
V_i input for validation of the value of (L_i)
Wr memory write control signal (1) and (2)
/1 1-bit binary signal
/v v-bit binary-signal bus
/w w-bit binary-signal bus, w=z.q
/z z-bit binary-signal bus

The invention claimed is:

1. An associative-memory-storage unit comprising:
at least one first memory sub-unit (1_1 to 1_n) each comprising $2^v$ words of w bits, the at least one first memory sub-unit forming a first set of n memory sub-units (n≥1);
a second memory sub-unit comprising $2^v$ words of v bits forming a second set;
each memory sub-unit comprising:
$2^v$ memory positions for storing the $2^v$ words, each position being identified by a memory address over v bits;
a v-bit memory-address input port (Adr);
a v- or w-bit data input port (In);
a v- or w-bit data output port (Out);
a v-bit memory-address output port (Cadr); and
a binary output (M) for validating a content;
each memory sub-unit being configured:
in a write mode, to store a word received via the data input port (In) at the address received via the memory-address input port (Adr);
in a read mode:
if one of the $2^v$ memory positions contains the word received via the data input port (In), to validate the binary output signal (M) for validating the content, and to deliver the address of said one of the $2^v$ memory positions to the memory-address output port (Cadr);
otherwise, to not validate the binary output signal (M) for validating the content.

2. The associative-memory-storage unit as claimed in claim 1, wherein each memory sub-unit comprises a command port that receives a sequencing binary input clock (Ck), a memory-selecting binary input signal (En) and a write binary input signal (Wr) that are common to all the memory sub-units, and is configured to:
activate the write mode when the memory-selecting binary input signal (En) and a write binary input signal (Wr) are activated;
to activate the read mode when the memory-selecting binary input signal (En) is activated, and the write binary input signal (Wr) is inactive.

3. The associative-memory-storage unit as claimed in claim 1, said unit being a non-volatile memory.

4. The associative-memory-storage unit as claimed in claim 1, comprising:
a first bus (AB), which is active in read and write mode;
a second bus, which is independent of the first, and active in read mode.

5. The associative-memory-storage unit as claimed in claim 4, wherein, in read mode:
the second bus is connected between the memory-address output ports (Cadr) of the at least one first memory sub-unit (1_1 to 1_n) and the memory-address input port (Adr) of the second memory sub-unit;
the first bus (AB) is connected between the memory-address output port (Cadr) of the second memory sub-unit and the memory-address input ports (Adr) of the at least one first memory sub-unit (1_1 to 1_n).

6. The associative-memory-storage unit as claimed in claim 5, wherein, in write mode, the first bus (AB) is connected to the output of a v-bit binary counter that generates a count of $2^v$ values, and is connected to the memory-address input port (Adr) of each memory sub-unit (1_1 to 1_n and 2).

7. The associative-memory-storage unit as claimed in claim 6, wherein the binary counter employs non-volatile memory storage.

8. The associative-memory-storage unit as claimed in claim 6, wherein each memory sub-unit comprises a command port that receives a sequencing binary input clock (Ck), a memory-selecting binary input signal (En) and a write binary input signal (Wr) that are common to all the memory sub-units, and is configured to:
  activate the write mode when the memory-selecting binary input signal (En) and a write binary input signal (Wr) are activated;
to activate the read mode when the memory-selecting binary input signal (En) is activated, and the write binary input signal (Wr) is inactive;
  further comprising:
  a unit for initializing the memory sub-units;
  a command port that receives as input an initialization-input binary signal (Ini) and the memory-selecting binary input signal (En);
  wherein, the activation of the initialization-input binary input signal (Ini) is transmitted to the initializing unit and generates, conjointly with the activation of the memory-selecting binary input signal (En), an initialization phase in which the initializing unit is configured, in order to initialize to zero all the memory positions of each memory sub-unit, to:
  initialize to zero the binary counter;
  activate the write binary input signal (Wr) in order to validate the write mode;
  force to zero the data input port (In) of each memory sub-unit;
  increment the binary counter by one unit on each cycle of the sequencing binary input clock (Ck) during $2^v+1$ cycles.

9. The associative-memory-storage unit as claimed in claim 8, wherein, outside of the initialization phase, if the memory-selecting binary input signal (En) is validated, the binary counter is incremented on each validation of the memory write signal (Wr).

10. The associative-memory-storage unit as claimed in claim 6, wherein the binary counter is configured to activate a count-limit signal (F) when the binary value of the counter is equal to $2^v-1$.

11. The associative-memory-storage unit as claimed in claim 6, wherein the binary counter is initialized to zero then incremented by one unit on command by a transfer binary signal (T) defining a transfer cycle, in the course of which the associative-memory-storage unit delivers as output a label (Lout_i) and a message (MEout_i) that are associated with the value of the counter (i).

12. The associative-memory-storage unit as claimed in claim 4, comprising a unit for selecting maximum likelihood, and wherein, in read mode:
  the first bus (AB) is connected to the memory-address output port (Cadr) of the second memory sub-unit and connected to the memory-address input ports (Adr) of each of the first memory sub-units of the first set (1_1 to 1_n);
  the second bus connects the output of each of the memory-address output ports (Cadr) and binary output signals (M) for validating the content of each of the first memory sub-units (1_1 to 1_n) of the first set to the input of the unit for selecting maximum likelihood;
  the unit for selecting maximum likelihood is configured to deliver as output the most represented value (L_i) among the input values, this value being introduced into the address input port (Adr) of the second memory sub-unit.

13. The associative-memory-storage unit as claimed in claim 12, wherein when a read-mode correcting binary input signal (Cor) is validated, the information items transmitted to the first bus (AB) are the output (L_i) of the unit for selecting the value of the maximum likelihood.

14. The associative-memory-storage unit as claimed in claim 6, wherein, in write mode, the value of the binary counter is incremented by one unit at the start of a write operation in order to deliver a value corresponding to the new address over the first bus (AB).

15. The associative-memory-storage unit as claimed in claim 8, comprising a unit for selecting maximum likelihood, and wherein, in read mode:
  the first bus (AB) is connected to the memory-address output port (Cadr) of the second memory sub-unit and connected to the memory-address input ports (Adr) of each of the first memory sub-units of the first set (1_1 to 1_n);
  the second bus connects the output of each of the memory-address output ports (Cadr) and binary output signals (M) for validating the content of each of the first memory sub-units (1_1 to 1_n) of the first set to the input of the unit for selecting maximum likelihood;
  the unit for selecting maximum likelihood is configured to deliver as output the most represented value (L_i) among the input values, this value being introduced into the address input port (Adr) of the second memory sub-unit;
  further comprising grouped together the first set of memory sub-units (1_1 to 1_n), the second set of memory sub-units, the binary counter, the unit for computing maximum likelihood, the initializing unit, and a set of logic control elements, said controlling unit forming a basic unit of the associative-memory-storage unit.

16. The associative-memory-storage unit as claimed in claim 15, associating, in read mode, an input message (MEin_i) consisting of n independent input sub-messages (RSin_1 to RSin_n) of w input bits with an output label (Lout_j) of v output bits and, a v-bit input label (Lin_i) with an output message (MEout_j) consisting of n w-bit independent output sub-messages (RSout_1 to RSout_n) and wherein:
  each of the data input ports (In) of the first memory sub-units of the first set respectively receives a w-bit input sub-message (RSin_1 to RSin_n);
  each of the output input ports (Out) of the first memory sub-units of the first set respectively emits an output sub-message (RSout_1 to RSout_n);
  the data input port of the second memory sub-unit receives the input label (Lin_i);
  the output data port of the second memory sub-unit emits the output label (Lout_i).

17. The associative-memory-storage unit as claimed in claim 16, wherein each w-bit input sub-message (RSin_x) and w-bit output sub-message (RSout_x) is structured into p elements of w/p bits with, for each element, a definition specific to its location.

18. The associative-memory-storage unit as claimed in claim 17, wherein each element of w/p bits may be placed independently in ternary-content-addressable-memory (TCAM) mode.

19. The associative-memory-storage unit as claimed in claim 18, wherein an element of w/p bits is placed in ternary-content-addressable-memory (TCAM) mode if it is poorly referenced or absent.

20. An associative-memory-storage device, comprising an associative-memory-storage unit as claimed in claim 16.

21. The associative-memory-storage device as claimed in claim 20, comprising:

at least one dynamic attractor (80_*x*) having an input-register unit and a result-register unit;

wherein a w-bit output sub-message (RSout_x) of the associative-memory-storage unit is delivered to the input-register unit of the dynamic attractor, and a w-bit input sub-message (RSin_x) of the associative-memory unit is delivered by the result-register unit of the dynamic attractor.

22. The associative-memory-storage device as claimed in claim 19, wherein the p elements of w/p bits of the w-bit input sub-messages (RSin_x) and w-bit output sub-messages (RSout_x) have, as definition specific to their respective locations, an elementary semantic representation of global, dynamic or structural type.

23. The associative-memory-storage device as claimed in claim 22, wherein the dynamic attractor (80_*x*) is configured to extract, from the streams of sub-sequence-containing sequenced data output from a unit for converting an input data stream, an elementary semantic representation of global type, dynamic type or structural type referenced by position and corresponding to a sub-message.

24. The associative-memory-storage device as claimed in claim 23, comprising a set of dynamic attractors, each dynamic attractor (80_*x*) defining an input sub-message (RSin_x) of the associative-memory-storage unit, receiving an input binary signal (Cin) and delivering an output binary signal (Cout), which is delivered as input to the following dynamic attractor (80_*x*+1), wherein the dynamic attractors of the set are recruited iteratively, a new dynamic attractor being recruited and added to the set when all the dynamic attractors of the set are locked and provided that a maximum number of dynamic attractors has not been reached, and that a number of similarities identified by the last dynamic attractor is not lower than a predefined threshold.

25. The associative-memory-storage device as claimed in claim 20, wherein the associative-memory-storage units of said set are connected in bidirectional pyramidal mode, and:
in one direction, a first level comprising a number (p) of associative-memory units that respectively receive p input messages and respectively generate p output labels that are each connected by way of input sub-message of an associative-memory unit of a second level, said associative-memory unit of the second level generating an output label summarizing the input sub-messages;
in the opposite direction, a second summarizing label is input into the associative-memory unit of the second level, which generates a set of p output sub-messages that are respectively connected by way of input labels of the set of p associative-memory units of the first level, which respectively deliver a set of p output messages.

26. A device comprising a first associative-memory-storage unit as claimed in claim 1, and a second associative-memory-storage unit as claimed in claim 1, and configured to perform a transfer of knowledge from the acquired associative memory storage of the first to the second unit, by connecting, with respect to the distribution of the information items, the output ports of the first unit to the input ports of the second unit, and by synchronizing the read cycle of the first unit with the write cycle of the second unit.

27. The associative-memory-storage device as claimed in claim 20, integrated into an electronic component.

28. The associative-memory-storage device as claimed in claim 20, stacked on an electronic chip.

29. A method for associative memory storage by an associative-memory-storage unit, comprising:

at least one first memory sub-unit (1_1 to 1_*n*) each comprising $2^v$ words of w bits, said at least one first memory sub-unit forming a first set of n memory sub-units (n≥1);

a second memory sub-unit comprising $2^v$ words of v bits forming a second set;

each memory sub-unit comprising:
$2^v$ memory positions for storing the $2^v$ words, each position being identified by a memory address over v bits;
a v-bit memory-address input port (Adr);
a v- or w-bit data input port (In);
a v- or w-bit data output port (Out);
a v-bit memory-address output port (Cadr); and
a binary output (M) for validating a content;

said method comprising:
in a write mode, storing a word received via the data input port (In) at the address received via the memory-address input port (Adr);
in a read mode:
if one of the $2^v$ memory positions contains the word received via the data input port (In), validating the binary output signal (M) for validating the content, and delivering the address of said one of the $2^v$ memory positions to the memory-address output port (Cadr);
otherwise, not validating the binary output signal (M) for validating the content.

30. The associative-memory-storage method as claimed in claim 29, wherein each memory sub-unit comprises a command port that receives a sequencing binary input clock (Ck), a memory-selecting binary input signal (En) and a write binary input signal (Wr) that are common to all the memory sub-units, said method comprising:
activating the write mode when the memory-selecting binary input signal (En) and a write binary input signal (Wr) are activated;
activating the read mode when the memory-selecting binary input signal (En) is activated, and the write binary input signal (Wr) is inactive.

31. The associative-memory-storage method as claimed in claim 29, comprising:
activating a first bus (AB) of the associative-memory unit in read and write mode;
activating a second bus of the associative-memory unit, independently of the first, in read mode.

32. The associative-memory-storage method as claimed in claim 31, wherein, in read mode:
the second bus is connected between the memory-address output ports (Cadr) of the at least one first memory sub-unit (1_1 to 1_*n*) and the memory-address input port (Adr) of the second memory sub-unit;
the first bus is connected between the memory-address output port (Cadr) of the second memory sub-unit and the memory-address input ports (Adr) of the at least one first memory sub-unit (1_1 to 1_*n*).

33. The associative-memory-storage method as claimed in claim 32, wherein, in write mode, the first bus (AB) is connected to the output of a v-bit binary counter that generates a count of $2^v$ values, and is connected to the memory-address input port (Adr) of each memory sub-unit (1_1 to 1_*n* and 2).

34. The associative-memory-storage method as claimed in claim 33, wherein the associative-memory-storage unit comprises:

a unit for initializing the memory sub-units;
a command port that receives as input an initialization-input binary signal (Ini) and the memory-selecting binary input signal (En);
said method comprising, in case of activation of the initialization-input binary input signal (Ini) and of the signal (En) for selecting all of the memories, an activation phase comprising, in order to initialize to zero all the memory positions of each memory sub-unit:
initializing, with the initializing unit, to zero the binary counter;
activating, with the initializing unit, the write binary input signal (Wr) in order to validate the write mode;
forcing to zero, with the initializing unit, the data input port (In) of each memory sub-unit;
incrementing, with the initializing unit, the binary counter by one unit on each cycle of the sequencing binary input clock (Ck) during $2^v+1$ cycles.

35. The associative-memory-storage method as claimed in claim 34, wherein, outside of the initialization phase, the memory-selecting binary input signal (En) is validated, and comprising incrementing the binary counter at each validation of the memory write signal (Wr).

36. The associative-memory-storage method as claimed in claim 33, comprising validating a count-limit signal (F) when the value of the v-bit binary counter reaches the value $2^v-1$.

37. The method as claimed in claim 33, comprising initializing the binary counter to zero then incrementing it by one unit on command by a transfer binary signal (T) defining a transfer cycle, in the course of which the associative-memory-storage unit delivers as output a label (Lout_i) and a message (MEout_i) that are associated with the value of the counter (i).

38. The associative-memory-storage method as claimed in claim 32, wherein the associative-memory-storage unit comprises a unit for selecting maximum likelihood, and, in read mode:
the first bus (AB) is connected to the memory-address output port (Cadr) of the second memory sub-unit and connected to the memory-address input ports (Adr) of each of the first memory sub-units of the first set (1_1 to 1_n);
the second bus connects the output of each of the memory-address output ports (Cadr) and binary output signals (M) for validating the content of each of the first memory sub-units (1_1 to 1_n) of the first set to the input of the unit for selecting maximum likelihood;
and the method comprises:
delivering, as output from the unit for selecting maximum likelihood, the most represented most represented value (L_i) among the input values, and introducing this most represented value (L_i) into the address input port (Adr) of the second memory sub-unit.

39. The associative-memory-storage method as claimed in claim 37, comprising, when a read-mode correcting binary input signal (Cor) is validated, transmitting information items from the output (L_i) of the unit for selecting the value of the maximum likelihood to the first bus (AB).

40. The associative-memory-storage method as claimed in claim 29, comprising, in write mode, incrementing the value of the binary counter by one unit at the start of a write operation in order to deliver a value corresponding to the new address over the common bus (AB).

41. The associative-memory-storage method as claimed in claim 34 wherein the first set of memory sub-units (1_1 to 1_n), the second set of memory sub-units, the binary counter, the unit for computing maximum likelihood, the initializing unit, and a set of logic control elements are grouped together, said controlling unit forming a basic unit of the associative-memory-storage unit.

42. The associative-memory-storage method as claimed in claim 41, comprising, in read mode, associating an input message (MEin_i) consisting of n independent input sub-messages (RSin_1 to RSin_n) of w input bits with an output label (Lout_j) of v output bits and, a v-bit input label (Lin_i) with an output message (MEout_j) consisting of n independent output sub-messages (RSout_1 to RSout_n) of w output bits, said method comprising:
receiving, with each of the data input ports (In) of the first memory sub-units of the first set respectively, a w-bit input sub-message (RSin_1 to RSin_n);
emitting, with each of the output input ports (Out) of the first memory sub-units of the first set respectively, an output sub-message (RSout_1 to RSout_n);
receiving, with the data input port of the second memory sub-unit, the input label (Lin_i);
emitting, with the output data port of the second memory sub-unit, the output label (Lout_i).

43. The associative-memory-storage method as claimed in claim 42, comprising structuring each w-bit input sub-message (RSin_x) and w-bit output sub-message (RSout_x) each into p elements of w/p bits with, for each element, a definition specific to its location.

44. The associative-memory-storage method as claimed in claim 43, comprising implementing each element of w/p bits independently in ternary-content-addressable-memory (TCAM) mode.

45. The associative-memory-storage method as claimed in claim 44, wherein each element of w/p bits is placed in ternary-content-addressable-memory (TCAM) mode if it is poorly referenced or absent.

46. The associative-memory-storage method as claimed in claim 42 wherein the associative-memory-storage unit as claimed in claim 42 is integrated into a device.

47. The associative-memory-storage method as claimed in claim 46, wherein the device comprises:
at least one dynamic attractor (80_x) having an input-register unit and a result-register unit;
said associative-memory-storage method comprising delivering a w-bit output sub-message (RSout_x) of the associative-memory-storage unit to the input-register unit of the dynamic attractor, and delivering a w-bit input sub-message (RSin_x) of the associative-memory unit with the result-register unit of the dynamic attractor.

48. The associative-memory-storage method as claimed in claim 43, wherein the p elements of w/p bits of the w-bit input sub-messages (RSin_x) and w-bit output sub-messages (RSout_x) have, as definition specific to their respective locations, an elementary semantic representation of global, dynamic or structural type.

49. The associative-memory-storage method as claimed in claim 48, comprising extracting, with the dynamic attractor (80_x), from the streams of sub-sequence-containing sequenced data output from a unit for converting an input data stream, an elementary semantic representation of global type, dynamic type or structural type referenced by position and corresponding to a sub-message.

50. The associative-memory-storage method as claimed in claim 49, wherein the device comprises a set of dynamic attractors, each dynamic attractor (80_x) defining an input sub-message (RSin_x) of the associative-memory-storage unit, receiving an input binary signal (Cin) and delivering an output binary signal (Cout), said method comprising delivering the output signal (Cout) of one of the dynamic attractors ($80\_x$) to the following dynamic attractor ($80\_x+1$), and wherein the dynamic attractors of the set are recruited iteratively, a new dynamic attractor being recruited and added to the set when all the dynamic attractors of the set are locked and provided that a maximum number of dynamic attractors has not been reached, and that a number of similarities identified by the last dynamic attractor is not lower than a predefined threshold.

51. The associative-memory-storage method as claimed in claim 46, wherein the device comprises a set of associative-memory-storage units comprising connecting the associative-memory-storage units ($10\_x$) of said set in bidirectional pyramidal mode, and:

in one direction, receiving, with a number (p) of associative-memory units of a first level, p messages and generating, with said associative-memory units of the first level, p output labels that are each connected by way of input sub-message of an associative-memory unit of a second level, said associative-memory unit of the second level generating a label summarizing the input sub-messages;

in the opposite direction, generating, with a second summarizing label input into the associative-memory unit of the second level, a set of p output sub-messages that are respectively connected by way of input labels of the set of p associative-memory units of the first level, which respectively deliver a set of p output messages.

52. The method for transferring knowledge from the acquired associative memory storage of a first associative-memory-storage unit of one device to a second associative-memory-storage unit of the device as claimed in claim 46 comprising connecting, with respect to the distribution of the information items, the output ports of the first unit to the input ports of the second unit, and synchronizing the read cycle of the first unit with the write cycle of the second unit.

\* \* \* \* \*